US011271782B1

(12) United States Patent
Anavangot et al.

(10) Patent No.: US 11,271,782 B1
(45) Date of Patent: Mar. 8, 2022

(54) CAPACITIVE COUPLING BASED FEEDBACK FOR DECISION FEEDBACK EQUALIZATION

(71) Applicant: Cadence Design Systems, Inc., San Jose, CA (US)

(72) Inventors: Vineeth Anavangot, Bangalore (IN); Maitri Misra, Kolkata (IN); Rajesh Cheeranthodi, Bangalore (IN)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 18 days.

(21) Appl. No.: 17/013,109

(22) Filed: Sep. 4, 2020

(51) Int. Cl.
*H04L 25/03* (2006.01)
*H03K 17/687* (2006.01)

(52) U.S. Cl.
CPC ... *H04L 25/03057* (2013.01); *H03K 17/6872* (2013.01)

(58) Field of Classification Search
CPC .............. H04L 25/03057; H03K 17/6872
See application file for complete search history.

(56) References Cited

U.S. PATENT DOCUMENTS

| 10,135,644 | B1* | 11/2018 | Rasmus | H04L 25/085 |
| 11,133,963 | B1* | 9/2021 | Zheng | H03M 1/1245 |
| 2019/0173484 | A1* | 6/2019 | Lee | H03M 1/08 |
| 2019/0173695 | A1* | 6/2019 | Qian | H04L 25/03019 |
| 2019/0199563 | A1* | 6/2019 | Zerbe | H04L 1/0026 |
| 2019/0312756 | A1* | 10/2019 | Musah | H04L 7/0334 |
| 2021/0152402 | A1* | 5/2021 | Lee | H04L 25/03159 |

* cited by examiner

*Primary Examiner* — Freshteh N Aghdam
(74) *Attorney, Agent, or Firm* — Tarolli, Sundheim, Covell & Tummino LLP

(57) ABSTRACT

In some examples, a receiver can include a sampler circuit that can be configured to process a data input signal corresponding to a current bit received at a receiver based on a capacitive weighted signal to compensate for distortion effects that a previously received bit at the receiver has on the data input signal. The receiver can include a capacitive coupling feedback circuit that can be configured to generate the capacitive weighted signal corresponding to a weighted detected bit of the previously received bit based on a capacitance of a subset of capacitors of a plurality of capacitors of the feedback circuit. The capacitive coupling feedback circuit can be configured to selectively control a number of capacitors of the plurality of capacitors that are connected in parallel corresponding to the subset of capacitors to control an amount of weight applied to the detected bit to generate the capacitive weighted signal.

20 Claims, 11 Drawing Sheets

CAPACITIVE COUPLING BASED FEEDBACK FOR DECISION FEEDBACK EQUALIZATION

TECHNICAL FIELD

The present disclosure relates to capacitive coupling based feedback for decision feedback equalization (DFE).

BACKGROUND

Intersymbol Interference (ISI) is a major source of error in high-speed communication applications. Equalizers can be applied to both transmitters and receivers to reduce or eliminate the effect of ISI associated with a channel (e.g., a communication medium). Among these equalizers, DFEs can be used. A DFE stores and feeds back the decisions that have been made for previously received data and subtracts the previously decided data from currently being received data to compensate for the ISI effects from the previously received data.

SUMMARY

In an example, a system can include a sampler circuit that can be configured to process a data input signal corresponding to a current bit received at a receiver based on a capacitive weighted signal to compensate for distortion effects that a previously received bit at the receiver has on the data input signal. The system can further include a capacitive coupling feedback circuit that can include a plurality of capacitors and can be configured to generate the capacitive weighted signal corresponding to a weighted detected bit of the previously received bit based on a capacitance of a subset of capacitors of the plurality of capacitors. The capacitive coupling feedback circuit can be configured to selectively control a number of capacitors of the plurality of capacitors that are connected in parallel corresponding to the subset of capacitors to control an amount of weight applied to the detected bit to generate the capacitive weighted signal.

In another example, a system can include a sampler circuit operating in a first clock domain and that can be configured to process a data input signal corresponding to a current bit received at a receiver based on a capacitive weighted signal to compensate for distortion effects that a previously received bit at the receiver has on the data input signal. The system can further include a capacitive coupling feedback circuit that can include a plurality of capacitors and can be configured to generate the capacitive weighted signal corresponding to a weighted detected bit of the previously received bit based on a capacitance of a subset of capacitors of the plurality of capacitors and a stage output signal. The stage output signal can be generated by another sampler circuit that can operate in a second clock domain. The other sampler circuit can be configured to generate the stage output signal during a processing of the data input signal, and the capacitive coupling feedback circuit can be configured to selectively control a number of capacitors of the plurality of capacitors that are connected in parallel corresponding to the subset of capacitors to control an amount of weight applied to the stage output signal to generate the capacitive weighted signal.

In a further example, a method can include receiving one of a detected data input signal that can be provided by a first sampler circuit and a stage output signal that can be provided by a second sampler circuit. The detected data input signal can correspond to a previously detected bit of a previously received bit at a receiver, and the stage output signal can be generated by the second sampler circuit during a processing of a subsequent data input signal corresponding to a current bit received at the receiver to compensate for distortion effects that the previously received data input signal has on the subsequent data input signal. The method can further include receiving one of a first clock signal and a second clock signal generated by a clock and data recovery circuit. The first clock signal can be a clocked delayed version of a first domain clock signal that can be associated with the first clock domain, and the second clock signal can be a clocked delayed version of a second domain clock signal that can be associated with the second clock domain. The method can further include receiving a plurality of tap weight signals to selectively control a number of cap circuits of a plurality of cap circuits to couple in parallel to control an amount of weight applied to one of the detected data input signal and the stage output signal based on one of the first and second clock signals. The method can further include generating a capacitive weight signal based on a capacitance of the number of cap circuits of the plurality of cap circuits coupled in parallel.

DETAILED DESCRIPTION

Figure 1:
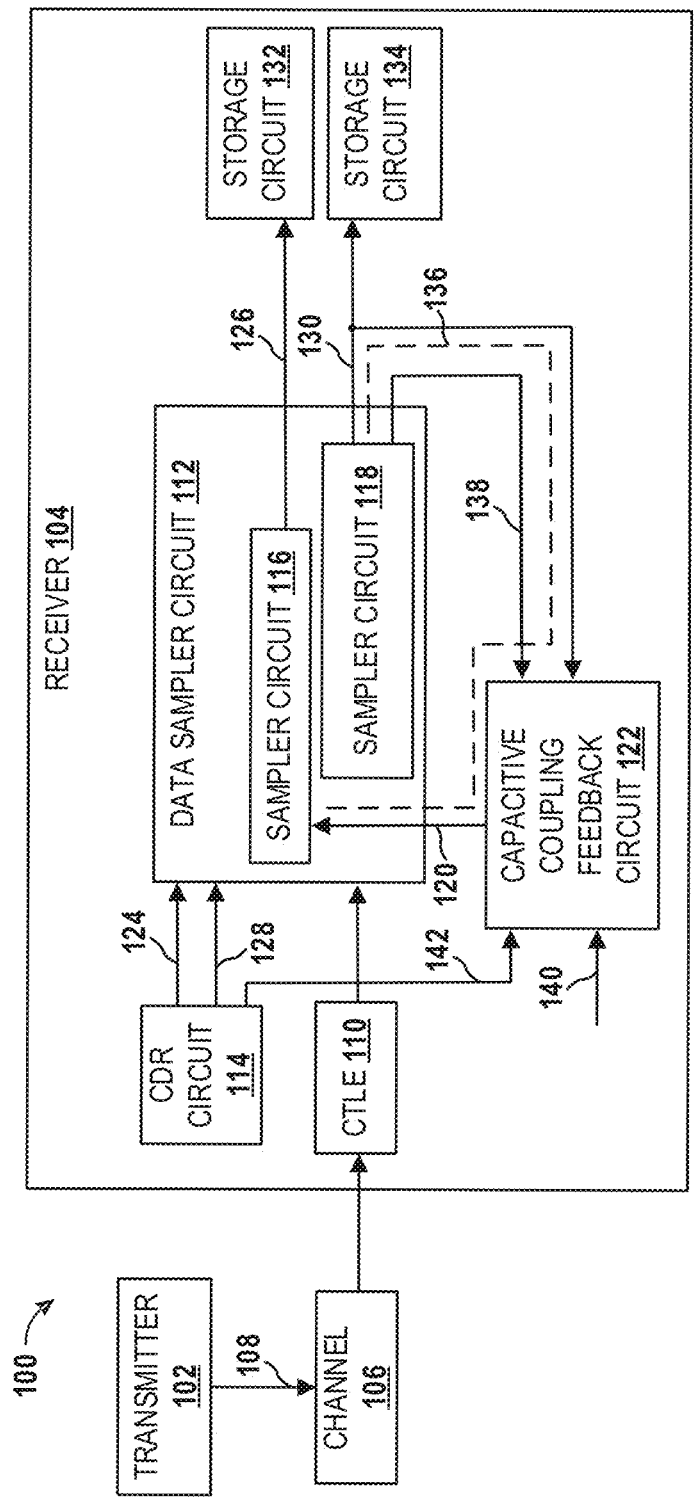
FIG. 1 illustrates an example of a communication system.

The present disclosure relates to DFE. Data transmitted over a communication medium or channel can be affected by ISI in which previously transmitted data (e.g., one or more bits, symbols, pulses, etc.) interferes with transmitted data being received at a receiver. The previously transmitted data can influence the transmitted data being provided to the receiver, such that a representation (e.g., value) of the transmitted data cannot be accurately determined (e.g., at a decision-making device). As data rates increase, a bandwidth of the communication channel can be reduced by physical effects, such as a skin effect, dielectric loss, and/or reflections due to impedance discontinuities in the communication channel. Reduction in channel bandwidth can lead to the broadening of the transmitted data over more than one unit interval (UI) and thus can cause data interference (e.g., symbol interference). A signal period or a UI as used herein can refer to a time interval for transmitted data and can be equal to an inverse of the data rate of a transmitter. For example, if the data rate is 15 gigabits per second (Gbits/s) for the transmitter, the UI of each bit, symbol, or pulse corresponding to the transmitted data can be $\frac{1}{10}^{10}$, which is 100 picoseconds (ps).

To mitigate the effects of ISI on the transmitted data, nonlinear equalizers such as DFE can be employed to equalize the channel effects on the transmitted data. In DFE, each previously detected bit is fed back (e.g., from an output of sampler circuit, a storage circuit, etc.) and applied to a corresponding tap generator. The tap generator can be configured to apply a coefficient value (e.g., a positive or negative value) to each previously detected bit and thus weight each previously detected bit by the coefficient value, such as by adding the coefficient value to the previously detected bit, subtracting the coefficient value from the previously detected bit, or multiplying the previously detected bit by the weighted coefficient value. The previously weighted bit can be provided from a respective tap generator to a summation circuit.

The summation circuit (e.g., a summation amplifier) can be configured to sum previously weighted bits and a current received bit to compensate for the ISI on the current bit caused by each previously transmitted bit over the communication channel. As such, if magnitudes and/or polarities of tap weights of respective tap generators are properly adjusted to match the channel characteristics of the communication channel, the ISI from the previously transmitted bits can be canceled, and the current transmitted bit can be detected by a data sampler or slicer at a low bit error rate (BER). The adjustment of the tap weights can be performed either manually or automatically by an adaptation algorithm (e.g., a least mean square (LMS) algorithm).

A major challenge in DFE circuitry design is the settling of feedback signals (e.g., the previously weighted bits) at the summation circuit in a tap feedback path. The tap feedback path can correspond to a signal path employed for generating the feedback signals. If the feedback signal does not settle within a period of time can reduce an eye-opening of the receiver (e.g., a vertical eye-opening), as more interference (e.g., ISI) is present on the communication channel. Thus, as the data rates increase for receivers, maintaining a closed-loop timing of tap feedback paths in DFE, such that the closed-loop timing is within an appropriate time range (e.g., based on DFE design requirements) is challenging. The term "closed-loop timing" as used herein can refer to an amount of time that may be needed for a previously weighted bit to settle within a given percentage (e.g., within 10% of a final value of the feedback signal) for ISI cancellation. The term "settle" as used herein can relate to a state of an amplitude of the feedback signal (e.g., the previously weighted bit) that is within a given amplitude range over a period of time. By way of example, a settled feedback signal can correspond to a feedback signal having an amplitude that is within a given percentage (e.g., within 5%, 10%, etc.) of a target amplitude for the feedback signal over the period of time.

Incomplete tap settling such as within 1 UI for a first tap, 2 UI for a second tap, and so on, can result in DFE errors due to different closed-loop settling times for different consecutive identical digits (CIDs). Moreover, the orthogonality of DFE correction can be reduced as a respective feedback signal can leak into other taps (e.g., successive taps) of the DFE circuitry. DFE techniques have made use of speculative taps (also known as unrolled taps) by loop unrolling a greater number of taps. However, in these implementations, the number of data samplers increases exponentially, as well as a hardware area and power requirements for implementing such a configuration. Moreover, loading on a wideband amplifier in the DFE circuitry which is employed to drive the data samplers also increases exponentially and thereby causes an exponential increase in the power requirements to meet bandwidth demands.

In some examples, a capacitive coupling feedback circuit as described herein can be employed as part of a tap feedback path to improve the closed-loop timing of the tap feedback path. By employing the capacitive coupling feedback circuit as part of the tap feedback path does not require the use of the summation circuit as in other DFE techniques. As such, the capacitive coupling feedback circuit improves the closed-loop timing of the tap feedback path by providing a capacitive weighted feedback signal to the data sampler (e.g., the slicer) rather than the summation circuit as in alternative DFE techniques that settles at a greater rate. Although examples are presented herein in which the capacitive coupling feedback circuit is implemented in first and second tap feedback paths, in other examples, the capacitive coupling feedback circuit can be employed in other tap feedback paths, such as a third feedback path, a fourth feedback path, etc. Thus, the examples herein should not be limited and/or construed to only improving a closed-loop timing of first and second tap feedback paths.

By employing the capacitive coupling feedback circuit as part of the respective tap feedback path (e.g., the first feedback path, the second feedback path, etc.) can reduce DFE errors resulting from different settling time values for different CIDs and can mitigate leakage of feedback signals to other taps in DFE circuitry, and thus can improve orthogonality of DFE correction. Moreover, by employing the capacitive coupling feedback circuit as part of the respective tap feedback path, loading on the wideband amplifier can be reduced, which can reduce the amount of power needed to meet bandwidth requirements or operating constraints for a communication system. Thus, by employing the capacitive coupling feedback circuit as part of the respective feedback path improves a vertical eye-opening of an eye diagram for the communication system, which improves the accuracy of detecting the current bit received at the receiver.

In some examples, the capacitive coupling feedback circuit can be combined (e.g., cascaded) with a zero-crossing adaption circuit (e.g., using a current digital-analog converter (IDAC)). The zero-crossing adaption circuit can improve a horizontal eye-opening of the eye diagram for the communication system, as described herein. Thus, employing the capacitive coupling feedback circuit with the zero-crossing adaption circuit can increase an overall quality of the eye diagram for the communication system as both the horizontal and vertical eye portions of the eye diagram can be improved. In some examples, the capacitive coupling feedback circuit can be employed in feedback loops at elevated data rates to fT ratios (e.g., a maximum circuit speed) where feedback settlings are not complete (e.g., the feedback signal has not settled). This is because the feedback is reset every UI and thus dependence of DFE feedback settling time on CIDs can be reduced (e.g., in some examples eliminated).

FIG. 1 illustrates an example of a communication system 100. The communication system 100 can include a transmitter 102 and a receiver 104. The transmitter 102 can be configured to communicate a data stream (e.g., symbols, bits, pulses, etc.) over a channel 106. In some examples, the channel 106 can be implemented as a circuit board, an optical fiber, a wireless medium, a trace, a cable, and/or free space. The communication system 100 can be implemented on a desktop computer, a laptop computer, a cellular phone, a personal organizer, a portable audio player, a tablet, a control circuit, a camera, a smartwatch, a virtual reality headset, a network node, such as a router or a server, a copier, a scanner, a printer, a game console, a television, a set-top video distribution or recording system, a cable box, a personal digital media player, a factory automation system, an automotive computer system, or a medical device. In other examples, a different type of device can be employed for implementing features and functions of the communication system 100, as described herein. In some examples, the transmitter 102 and the receiver 104 can be implemented as a system on chip (SOC), or be implemented with standalone components. In additional or alternative examples, the transmitter 102 and the receiver 104 can be implemented as part of a corresponding transceiver.

By way of further example, the communication system 100 can be implemented in a memory controller environment. In these examples, the transmitter 102 can be implemented at a memory controller and the receiver 104 can be implemented at a memory device. Data can be written to and read from the memory device, for example, by the memory controller, whereby the memory device can operate as volatile memory, such as double data rate random-access memory (DDRAM). The memory device can be implemented as a double data rate 3 (DDR3) device, a double data rate 4 (DDR4) device, a low power DDR3 (LPDDR3) device, a low power DDR4 (LPDDR4) device, a Wide I/O 2 (WIO2) device, a high bandwidth memory (HBM) dynamic random-access memory (DRAM) device, HBM 2 DRAM (HBM2 DRAM) device a double data rate 5 (DDR5) device, and a low power DDR5 (LPDDR5) device (e.g., mobile DDR). In some examples, the transmitter 102 can be implemented at the memory device and the memory controller can be implemented at the receiver 104.

In some examples, the transmitter 102 can be configured to transmit a sequence of bits 108. In some examples, the sequence of bits 108 can be represented by an optical signal, and in other examples, the sequence of bits 108 can be represented by an analog signal. As the sequence of bits 108 propagate from the transmitter 102 to the receiver 104 the sequence of bits 108 can be subjected to crosstalk, additive white Gaussian noise, and/or channel loss (e.g., channel dispersion and/or frequency-dependent attenuation). For example, a first bit (also referred to herein as a current bit) can be identified herein as a bit "n" and can be received at the receiver 104 at time $t_0$, as a distorted bit n (e.g., bit n having been distorted by ISI). A first most recent bit received before the distorted bit n, e.g., received at the time of $t_1$ preceding time $t_0$, may be identified as n−1. A second most recent bit received at the receiver 104 before the first most recent bit n−1, e.g., received at the time of $t_2$ preceding time $t_1$, can be identified as n−2. A third most recent bit received at receiver 104 at time $t_3$ preceding time $t_2$ before the most recent bit n−2 can be identified as n−3.

The first, second, and third most recent bits n−1, n−2, and n−3 can be referred to as interfering bits that can interfere and thus distort the received bit n (e.g., the bits n−1, n−2, and n−3 can cause ISI to the transmitted bit n over the channel 106). In some examples, the bits n−1, n−2, and n−3 received at receiver 104 can be referred to previous bits and thus as first, second, and third previous bits. Because of the ISI resulting from at least one of the most recent bits n−1, n−2, and n−3, the distorted bit n can have a different shape from a corresponding bit in the sequence of bits 108 transmitted by the transmitter 102 to the receiver 104 over the channel 106. In examples, wherein three previously transmitted bits (e.g., the bits n−1, n−2, and n−3) have been determined to cause ISI to the transmitted n, at least one sampler circuit can be configured with three tap feedback paths. In some examples, as described herein, a first and/or second tap feedback path associated with the at least one sampler circuit can include a capacitive coupling feedback circuit, as described herein, to provided capacitive weighted bit signals based on most recent detected bits that have been determined based on respective previously bits.

In some examples, the receiver 104 includes a continuous-time linear equalizer (CTLE) 110 to compensate for at least some of the channel effects (e.g., channel losses). In some examples, the CTLE 110 can be referred to as an analog front-end (AFE) equalizer that can be configured to function as a filter having parameters initially based on an estimate of channel characteristics of the channel 106. Because of the imperfect characteristics of the channel 106 and effects (e.g., residue) of the previous bits, such as the bits n−1, n−2, and n−3, residual signals from the most recent received bits can cause ISI in the current bit received at the receiver 104. This is because the residual signals can be received at about the same time as the current bit, and the residual signals can be superimposed on the current bit.

In some examples, the receiver 104 includes a data sampler circuit 112. The data sampler circuit 112 can be configured to determine (e.g., decide) whether the current bit n is a first value (e.g., a zero value) or a second value (e.g., a non-zero value) according to clock timing signals from a clock and data recovery (CDR) circuit 114. The CDR circuit 114 can be configured to adjust a phase and a frequency of a local clock generated by a clock generator of the receiver 104 for sampling the sequence of bits 108 for proper data detection. In some examples, the CDR circuit 114 includes the clock generator. For example, the phase of the sequence of bits 108 can be unknown and there can be a frequency offset between the frequency at which the original data corresponding to the sequence of bits 108 was transmitted and the sampling clock frequency of the receiver 104. The CDR circuit 114 can be configured to detect a timing of the sequence of bits 108 and employ the detected timing to set a correct frequency and phase of the local clock from which the sampling clock for sampling of subsequent incoming data signal can be achieved.

In some examples, the data sampler circuit 112 can be configured to employ the clock phase and in some examples set a voltage threshold to detect a predetermined point in a data eye for detecting the current bit n. Clocking the data sampler circuit 112 with a clock signal with a known frequency and phase based on the detected timing of the sequence of bits 108 can allow for clock recovery of information within the sequence of bits 108. In some examples, the CDR circuit 114 can be employed as a baud-rate CDR circuit and/or a bang-bang circuit. In bang-bang or Alexander type CDR circuits, the sequence of bits 108 can be sampled twice every symbol period corresponding to a UI of the symbol period. In a baud-rate CDR circuit, the sequence of bits 108 can be sampled at the baud rate, e.g., once every UI, so oversampling may not be needed. The sampling phase can be selected based on different criteria. For example, in a minimized mean-squared-error (MMSE) baud-rate CDR, the sampling phase that yields an MMSE can be chosen.

In some examples, the receiver 104 can be configured as a full rate, half rate, or a quarter rate receiver. In the examples presented herein, the receiver 104 is implemented as a quarter rate receiver. However, in other examples, the receiver 104 can be implemented according to any clocking architecture. Thus, in some examples, an eight rate clocking or sixteenth-rate clocking architecture can be used at the receiver 104. By way of example, the CDR circuit 114 can be configured to generate four data sampling clock signals (e.g., a clock signal clk0, a clock signal clk90, a clock signal clk180, and a clock signal clk270). Each of the four data sampling clock signals can have a period equal to a length of 4 cycles of a data input stream corresponding to the sequence of bits 108.

In some examples, the data sampler circuit 112 can be configured to operate according to a number of clock domains. For example, if the data sampler circuit 112 is configured to operate according to four clock domains (e.g., clock-0 domain, clock-90 domain, clock-180 domain, and clock-270 domain), each clock domain of the four clock domains can be provided with the sequence of bits 108. Each sampler circuit of each clock domain can be configured to receive the sequence of bits 108, such as for decision making and in some examples edge error correction. In some examples, a respective clock domain can include two sampler circuits. Thus, in examples wherein a DFE implementation is loop unrolled, the respective clock domain can include respective sampler circuits that can operate on similar clock signals. In some examples, the respective clock domain can include a data sampler and an error sampler (e.g., that can be used for LMS adaptation and on eye chip monitoring). In some examples, the receiver 104 can include a first sampler circuit 116 and a second sampler circuit 118. The first sampler circuit 116 can be associated with a first clock domain. The second sampler circuit 118 can be associated with a second clock domain. In some examples, the first sampler circuit 116 can be associated with the clock-0 domain, and the second sampler circuit 118 can be associated with the clock-180 domain. In other examples, the first sampler circuit 116 can be associated with the clock-0 domain, and the second sampler circuit 118 can be associated with the clock-270 domain.

The data sampler circuit 112 can be configured to receive the current bit (e.g., the distorted bit) and provide the current bit to each of the first and second sampler circuits 116 and 118. In some examples, the first sampler circuit 116 can be configured to receive a capacitive weighted signal 120 corresponding to a capacitive weighted previously detected bit of the previous bit. In some examples, the first sampler circuit 116 can be representative of multiple sampler circuits, and each of the sampler circuits can be configured to receive the capacitive weighted signal 120. The capacitive weighted signal 120 can be generated by a capacitive coupling feedback circuit 122. The first sampler circuit 116 can be configured to process the current bit based on the capacitive weighted signal 120 according to a set of clock signals 124 provided by the CDR circuit 114 to determine (e.g., decide) whether the current bit is a first value (e.g., a zero value) or a second value (e.g., a non-zero value). The first sampler circuit 116 can be configured to output a first detected bit 126 based on the decision. By way of example, the set of clock signals 124 can include the clock signal clk0, a delayed version of the clock signal clk0, and a delayed version of the clock signal clk180. In some examples, the set of clock signals 124 can include the clock signal clk0, the delayed version of the clock signal clk0, and a delayed version of the clock signal clk270.

In some examples, the second sampler circuit 118 can be configured to process a weighted previously detected bit according to a second set of clock signals 128 for the second clock domain provided by the CDR circuit 114 to determine (e.g., decide) whether the current bit has the first value or the second value. The weighted previously detected bit can be generated based on rolled or unrolled loop techniques that can employ a tap generator circuit. The tap generator circuit can be configured to apply a coefficient value (e.g., a positive or negative value) to the previously detected bit to weight the previously detected bit, such as by adding the coefficient value to the previously detected bit to provide the weighted previously detected bit, subtracting the coefficient value from the previously detected bit, or multiplying the previously detected bit by the weighted coefficient value. The second sampler circuit 118 can be configured to output a second detected bit 130 based on the decision. In some examples, the second set of clock signals 128 can include the clock signal clk180, the delayed version of the clock signal clk180, and the delayed version of the clock signal clk0. In other examples, the second set of clock signals 128 can include clock signal clk270, the delayed version of the clock signal clk270, and the delayed version of the clock signal clk0.

In some examples, the receiver 104 can include a first storage circuit 132 and a second storage circuit 134. The first storage circuit 132 can be employed to store the first detected bit 126 and the second storage circuit 134 can be employed to store the second detected bit 130. In some examples, the first and second storage circuits 132 and 134 can be shift registers. In some examples, at least some of the storage circuits 132 and 134 can form part of the data sampler circuit 112. In some examples, the receiver 104 includes at least one tap feedback path 136 for the first sampler circuit 116 associated with the first clock domain. The at least one feedback path 136 can correspond to a signal path that can extend from the second sampler circuit 118 through the capacitive coupling feedback circuit 122 to the first sampler circuit 116, as illustrated in FIG. 1. In some examples, the at least one tap feedback path 136 can correspond to a first tap feedback path or a second tap feedback path. Each feedback path 136 can have an associated closed-loop timing.

In some examples, the at least one tap feedback path 136 can correspond to a critical path (e.g., the first tap feedback path) because timing along this path can present a challenge in closing the associated closed-loop timing. In examples wherein the at least one feedback path 136 is the first tap feedback path for the first sampler circuit 116, the capacitive coupling feedback circuit 122 can be configured to receive a second stage output signal 138 from the second sampler circuit 118. The second sampler circuit 118 can be configured to generate the second stage output signal based on the weighted previously detected bit and the current bit according to at least some of the second set of clock signals 128 (e.g., the clock signal clk180 and the delayed version of the clock signal clk180).

In some examples, the at least one tap feedback path 136 can correspond to a second tap feedback path. In examples wherein the at least one feedback path 136 is the second tap feedback path for the first sampler circuit 116, the capacitive coupling feedback circuit 122 can be configured to receive the second detected bit 130. By employing the capacitive coupling feedback circuit 122 as part of the first and/or second feedback paths can improve a respective DFE tap timing corresponding to improving the closed-loop timing of the first and/or second feedback paths. Although examples are presented wherein the closed-loop timing of the first and/or second feedback paths is improved via the capacitive coupling feedback circuit 122, in other and/or additional examples, the capacitive coupling feedback circuit 122 can be employed in other feedback paths (e.g., a third feedback path, a fourth feedback path, etc.) to improve a corresponding closed-loop timing.

By way of further example, the capacitive coupling feedback circuit 122 can be configured to generate the capacitive weighted signal 120 based on at least one tap weight signal 140, which can be generated by a controller (not shown in FIG. 1). The at least one tap weight signal 140 can be employed to control a number of capacitors of the capacitive coupling feedback circuit 122 that can be connected in parallel to control an amount of weight applied to the second detected bit 130 or the second stage output signal 138 to provide the capacitive weighted signal 232. Each of the capacitors of the plurality of capacitors can have a capacitance. Because an overall capacitance of an electrical circuit containing respective capacitors connected in parallel is a sum of the capacitances of the respective capacitors, the amount of weight applied to the second stage output signal 138 and/or the second detected bit 130 can be based on the number of capacitors of the capacitors that can be connected in parallel.

The number of capacitors of the capacitors that are connected in parallel can be based on the amount of weight that may be needed to compensate for ISI effects caused by a previously received data input signal (e.g., the previously received bit, such as for example, bit n−1, bit n−2, etc.). Accordingly, the at least one tap weight signal 140 can control the amount of weight that the capacitive coupling feedback circuit 122 applies to the second detected bit 130 and/or the second stage output signal 138 to provide the capacitive weighted signal 120. By employing controllable capacitors in the at least one feedback path 136 to provide for weighting of a feedback signal (e.g., the stage output signal 138 or the second detected bit 130) can improve a respective DFE feedback settling time for a corresponding tap feedback path to enable accurate sampling at the first sampler circuit 116.

In some examples, the capacitive coupling feedback circuit 122 can be employed as part of the first feedback path. The capacitive coupling feedback circuit 122 can be configured to receive the second stage output signal 138 generated by the second sampler circuit 118 operating in the second clock domain. The capacitive coupling feedback circuit 122 can be configured to generate the capacitive weighted signal 120 based on the capacitance of the capacitors connected in parallel in response to the at least one tap weight signal 140, and further based on the second stage output signal 138 according to a delayed clock signal 142 of a clock signal that can be associated with a clock domain (e.g., the clock-270 domain). In some examples, the delayed clock signal 142 can correspond to the delayed version of the clock signal clk270.

In some examples, the capacitive coupling feedback circuit 122 can be employed as part of the second feedback path. The capacitive coupling feedback circuit 122 can be configured to receive the second detected bit 126 generated by the second sampler circuit 118 operating in the second clock domain. The capacitive coupling feedback circuit 122 can be configured to generate the capacitive weighted signal 120 based on the capacitance of the capacitors connected in parallel in response to the at least one tap weight signal 140, and based on the second detected bit 126 according to the delayed clock signal 142. In some examples, the delayed clock signal 142 can be a clock delayed version of a clock signal (e.g., the clock signal clk180) that can be associated with another clock domain (e.g., the clock-180 domain) and thus can correspond to a delayed clock signal (e.g., the clock delayed version of the clock signal clk180).

By employing the capacitive coupling feedback circuit 122 as part of the at least one tap feedback path 136 can improve the closed-loop timing of the at least one tap feedback path 136, such that a feedback signal (e.g., the capacitive weighted signal 120) settles within a corresponding tap time interval (e.g., a first feedback signal settles within 1 UI, a second feedback signal settles within 2 UI, etc.). Therefore, DFE errors resulting from different settling time values for different CIDs can be reduced by employing the capacitive coupling feedback circuit 122 as part of the at least one tap feedback path 136, as described herein, which can mitigate leakage of feedback signals to successive taps, and improve an orthogonality of DFE correction in contrast to other DFE techniques. Moreover, by employing the capacitive coupling feedback circuit 122, as described herein, as part of the at least one tap feedback path 136 can reduce loading on a wideband amplifier and thus can reduce the amount of power needed to meet bandwidth requirements or operating constraints.

Figure 2:
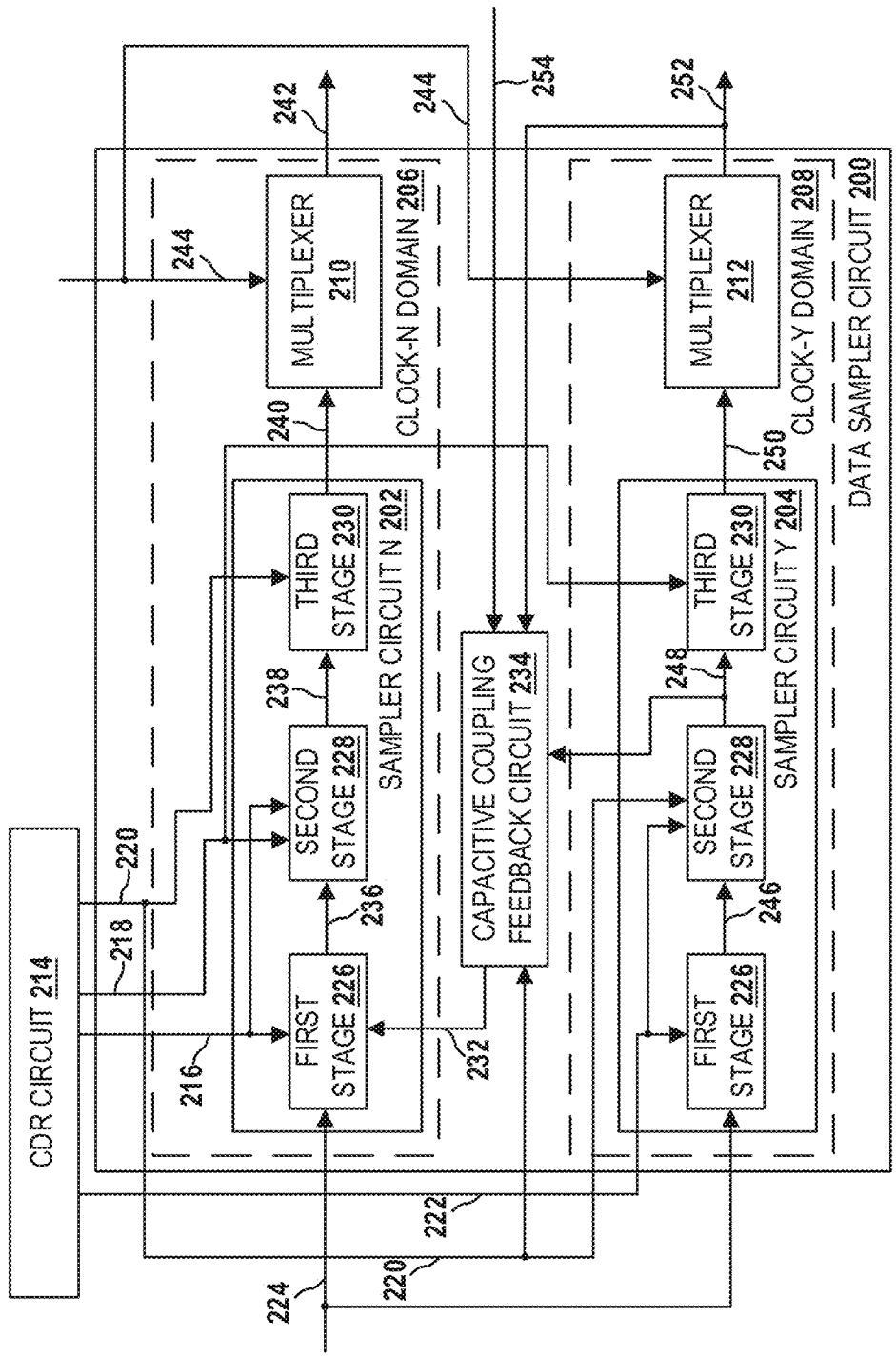
FIG. 2 illustrates an example of a data sampler circuit.

FIG. 2 illustrates an example of a data sampler circuit 200. In some examples, the data sampler circuit 200 can correspond to the data sampler circuit 112, as illustrated in FIG. 1. Thus, in some examples, references can be made to the example of FIG. 1 in the description with respect to FIG. 2. The data sampler circuit 200 can include sampler circuits 202 and 204 that can be operated in a corresponding clock domain 206 and 208 (e.g., the sampler circuits 202 and 204 are clocked according to a respective clock domain 206 and 208 in which the sampler circuit resides). In some examples, each clock domain 206 and 208 can include multiplexers 210 and 212. Each of the sampler circuits 202 and 204 and/or respective multiplexer 210 and 212 can be configured to operate based on clock signals received from a CDR circuit 214. In some examples, the CDR circuit 214 can correspond to the CDR circuit 114, as illustrated in FIG. 1.

The clock domain 206 can be associated with a respective clock signal being provided by the CDR circuit 214 of a receiver clocking architecture to the data sampler circuit 200 and thus can be labeled in FIG. 2 as "CLOCK-N DOMAIN," wherein N can be representative of the respective clock signal. Thus, the sampler circuit 202 and the multiplexer 210 can be operated in the clock-N domain. For example, if the respective clock signal corresponds to a clock signal clk0 generated by the CDR circuit 214, the clock domain 206 can correspond to clock-0 domain 206. The clock domain 208 can be associated with another respective clock signal being provided by the CDR circuit 214 to the data sampler circuit 200 and thus can be labeled in FIG. 2 as "CLOCK-Y DOMAIN," wherein Y can be representative of the other respective clock signal. Thus, the sampler circuit 204 and the multiplexer 208 can be operated in the clock-Y domain. For example, if the other respective clock signal corresponds to a clock signal clk180 generated by the CDR circuit 214, the clock domain 208 can correspond to the clock-180 domain.

For clarity and brevity purposes, FIG. 2 illustrates by way of example two clock domains. However, in some examples of FIG. 2, more than two clock domains can be employed based on the receiver clocking architecture. For example, if the receiver 104 is implemented as a quarter rate receiver, the data sampler circuit 200 can include four clock domains (e.g., a clock-0 domain, a clock-90 domain, a clock-180 domain, and a clock-270 domain). The clock domains 206 and 208 can correspond to a respective clock domain of the four clock domains. For example, the clock domain 206 can correspond to the clock-0 domain and the clock domain 208 can correspond to the clock-180 domain. Each of the sampler circuits and multiplexers of each clock domain can be operated in a corresponding clock domain.

By way of example, FIG. 2 illustrates that the clock domain 206 and the clock domain 208 respectively including a single sampler circuit. However, in some examples, the clock domains 206 and 208 can include a plurality of sampler circuits. Each sampler circuit 202 of the clock-N domain 206 is labeled in FIG. 2 as "SAMPLER CIRCUIT N," wherein N can be representative of the respective clock signal. Each sampler circuit 204 associated with the clock-Y domain 208 is labeled in FIG. 2 as "SAMPLER CIRCUIT Y," wherein Y can be representative of the other respective clock signal. In some examples, each sampler circuit 202 and 204 can be representative of at least two sampler circuits (e.g., in some examples referred to as +h1 and −h1 samplers). For example, if a respective DFE tap is loop unrolled, two sampler circuits can be employed that operate on the same clock signal. Thus, in these examples, the sampler circuit 202 and/or the sampler circuit 204 can correspond to at least one of the two samplers in the loop unrolled DFE implementation. In some examples, if the respective DFE tap is non-loop unrolled DFE, the two sampler circuits can correspond to a data sampler and an error sampler. Thus, in these examples, the sampler circuit 202 and/or the sampler circuit 204 can correspond to at least one of the two samplers in the non-loop unrolled DFE implementation.

In some examples, during an operation of the receiver 104, the CDR circuit 214 can be configured to generate a clock signal 216, a clock signal 218, and a clock signal 220. The clock signals 216, 218, and 220 can collectively define the set of clock signals 124, as illustrated in FIG. 1. The clock signals 216, 218, and 220 can be provided to the sampler circuit 202 operating in the clock domain 206 to control the processing of signals at the sampler circuit 202. In some examples, the clock signal 216 can correspond to the clock signal clk0 and the clock signal 218 can correspond to a time-delayed version of the clock signal clk0. Thus, in some examples, the clock signal 218 can be referred to as a clock delayed signal clk0_delayed. A time-delayed version of a respective clock signal can be referred to herein as a delayed clock signal X_delayed, wherein X can be indicative of the respective clock signal. The CDR circuit 214 can be configured to generate the delayed clock signal such that a rising edge of the delayed clock signal can rise a period of time after a rising edge of the respective clock signal. In some examples, the clock signal 220 can correspond to a clock delay version of the clock signal clk180 and thus can be referred to as clock delayed signal clk180_delayed.

In some examples, during the operation of the receiver 104, the CDR circuit 214 can be configured to generate a clock signal 222. The clock signal 222 and the clock signals 218 and 220 can be provided to the sampler circuit 204 operating in the clock domain 208 to control the processing of signals at the sampler circuit 204. In some examples, the clock signal 222 can correspond to the clock signal clk180. In other examples, the clock signal 222 can correspond to the clock signal clk270 and the clock signal 220 can correspond to the clock signal clk270_delayed. The clock signals 218, 220, and 222 can collectively define the set of clock signals 128, as illustrated in FIG. 1.

In some examples, during the operation of the receiver, the sampler circuits 202 and 204 can be configured to receive a data input signal 224. In some examples, the data input signal 224 is a differential data input signal 224. The data input signal 224 can be representative or correspond to a current bit (e.g., distorted bit) received at the receiver 104, as described herein with respect to FIG. 1. For example, the data input signal 224 can be provided from a CTLE, such as the CTLE 110, as illustrated in FIG. 1. Each of the sampler circuits 202 and 204 can include a plurality of stages 226, 228, and 230.

The first stage 226 of the sampler circuit 202 can be configured to receive the data input signal 224 and a capacitive weighted signal 232 corresponding to a capacitive weighted previously detected bit of a previous bit received at the receiver. The capacitive weighted signal 232 can be generated by a capacitive coupling feedback circuit 234. In some examples, the capacitive weighted signal 232 can correspond to a differential capacitive weighted signal. The capacitive coupling feedback circuit 234 can correspond to the capacitive coupling feedback circuit 122, as illustrated in FIG. 1. Thus, in some examples, the capacitive weighted signal 232 can correspond to the capacitive weighted signal 120, as illustrated in FIG. 1. The capacitive coupling feedback circuit 234 can be configured to provide the capacitive weighted signal 232 to the first stage 226 of the sampler circuit 202 operating in the clock domain 206. In some examples, each clock domain 206 and 208 can be associated with a respective capacitive coupling feedback circuit similar to the capacitive coupling feedback circuit 234. The plurality of stages 226, 228, and 230 can be implemented according to any sampler architecture (e.g., circuit design). Thus, the capacitive coupling feedback circuit 234 can be configured to provide for DFE for any sampler configuration design irrespective of stage circuit design. Although FIG. 2 describes ISI compensation by use of capacitive weighted signals with respect to the sampler circuit 202, in other examples a respective capacitive coupling feedback circuit can be employed to provide for ISI for the sampler circuit 204 based on capacitive weighted signals in a same or similar manner as described herein with respect to the sampler circuit 202.

In some examples, the first stage 226 of the sampler circuit 202 can be configured to combine the data input signal 224 and the capacitive weighted signal 232 to provide an amplified data signal 236 based on the clock signal 216. The amplified data signal 236 can be supplied to the second stage 228 of the sampler circuit 202. The second stage 228 of the sampler circuit 202 can be configured to convert (e.g., quantize) the amplified data signal 236 to provide a quantized data signal 238 based on the clock signal 216 and the clock signal 220. The quantized data signal 238 can be provided to the third stage 230 of the sampler circuit 202. The third stage 230 of the sampler circuit 202 can be configured to output a third stage data signal 240 to the multiplexer 210 based on the clock signal 220. The multiplexer 210 can be configured to output a first detected bit 242 based on the third stage data signal 240 and a previously detected bit 244. In some examples, the first detected bit 242 can correspond to the first detected bit 126, as illustrated in FIG. 1.

In some examples, the first stage 226 of the sampler circuit 204 can be configured to process the data input signal 224 to provide an amplified data signal 246 based on the clock signal 220. The amplified data signal 246 can be supplied to the second stage 228 of the sampler circuit 204. The second stage 228 of the sampler circuit 204 can be configured to convert (e.g., quantize) the amplified data signal 246 to provide a quantized data signal 248 based on the clock signal 220 and the clock signal 222. The quantized data signal 248 can be provided to the third stage 230 of the sampler circuit 204. The third stage 230 of the sampler circuit 204 can be configured to output a third stage data signal 250 to the multiplexer 212 based on the clock signal 218. The multiplexer 212 can be configured to output a second detected bit 252 based on the third stage data signal 250 and the previously detected bit 244. In some examples, the second detected bit 252 can correspond to the second detected bit 130, as illustrated in FIG. 1.

In some examples, the capacitive coupling feedback circuit 234 can be employed as part of a first tap feedback path. The first tap feedback path can correspond to the at least one tap feedback path 136, as illustrated in FIG. 1. In examples wherein the capacitive coupling feedback circuit 234 is employed as part of the first feedback path for a first tap, the multiplexer 212 may be omitted. Moreover, in examples wherein the capacitive coupling feedback circuit 234 is employed as part of the first tap feedback path, the capacitive coupling feedback circuit 234 can be configured to generate the capacitive weighted signal 232 based on the quantized data signal 248 and at least one tap weight signal 254 according to the clock signal 220. In some examples, the clock signal 220 can correspond to the clock signal 142, and the tap weight signal 254 can correspond to the at least one tap weight signal 140, as illustrated in FIG. 1. The at least one tap weight signal 254 can be employed to control a number of capacitors of the capacitive coupling feedback circuit 234 that are connected in parallel in response to the at least one tap weight signal 254 to control an amount of weight applied to the quantized data signal 248 to provide the capacitive weighted signal 232. The quantized data signal 248 can correspond to the second stage output signal 138, as illustrated in FIG. 1.

In some examples, the capacitive coupling feedback circuit 234 can be employed as part of a second tap feedback path. The second tap feedback path can correspond to the at least one tap feedback path 136, as illustrated in FIG. 1. Moreover, in examples wherein the capacitive coupling feedback circuit 234 is employed as part of the second tap feedback path, the capacitive coupling feedback circuit 234 can be configured to generate the capacitive weighted signal 232 based on the detected bit signal 252 and the at least one tap weight signal 254 according to the clock signal 220 and the clock signal 220. Although FIG. 2 illustrates the capacitive weighted signal 232 being generated based on the detected bit signal 252, in other examples, the capacitive weighted signal 232 can be generated based on the third stage data signal 250.

By employing the capacitive coupling feedback circuit 234 as part of a respective tap feedback path can improve a closed-loop timing of the respective tap feedback path, such that a feedback signal (e.g., the capacitive weighted signal 232) settles within a corresponding tap time interval (e.g., a first feedback signal settles within 1 UI, a second feedback signal settles within 2 UI, etc.). Therefore, DFE errors resulting from different settling time values for different CIDs can be reduced by employing the capacitive coupling feedback circuit 234 as part of the respective tap feedback path, and thus can mitigate leakage of feedback signals to other taps and improve an orthogonality of DFE correction in contrast to other DFE techniques. Moreover, by employing the capacitive coupling feedback circuit 234 as part of the respective tap feedback path can reduce loading on a wideband amplifier and thus reduce the amount of power needed to meet bandwidth requirements or operating constraints.

Figure 3:
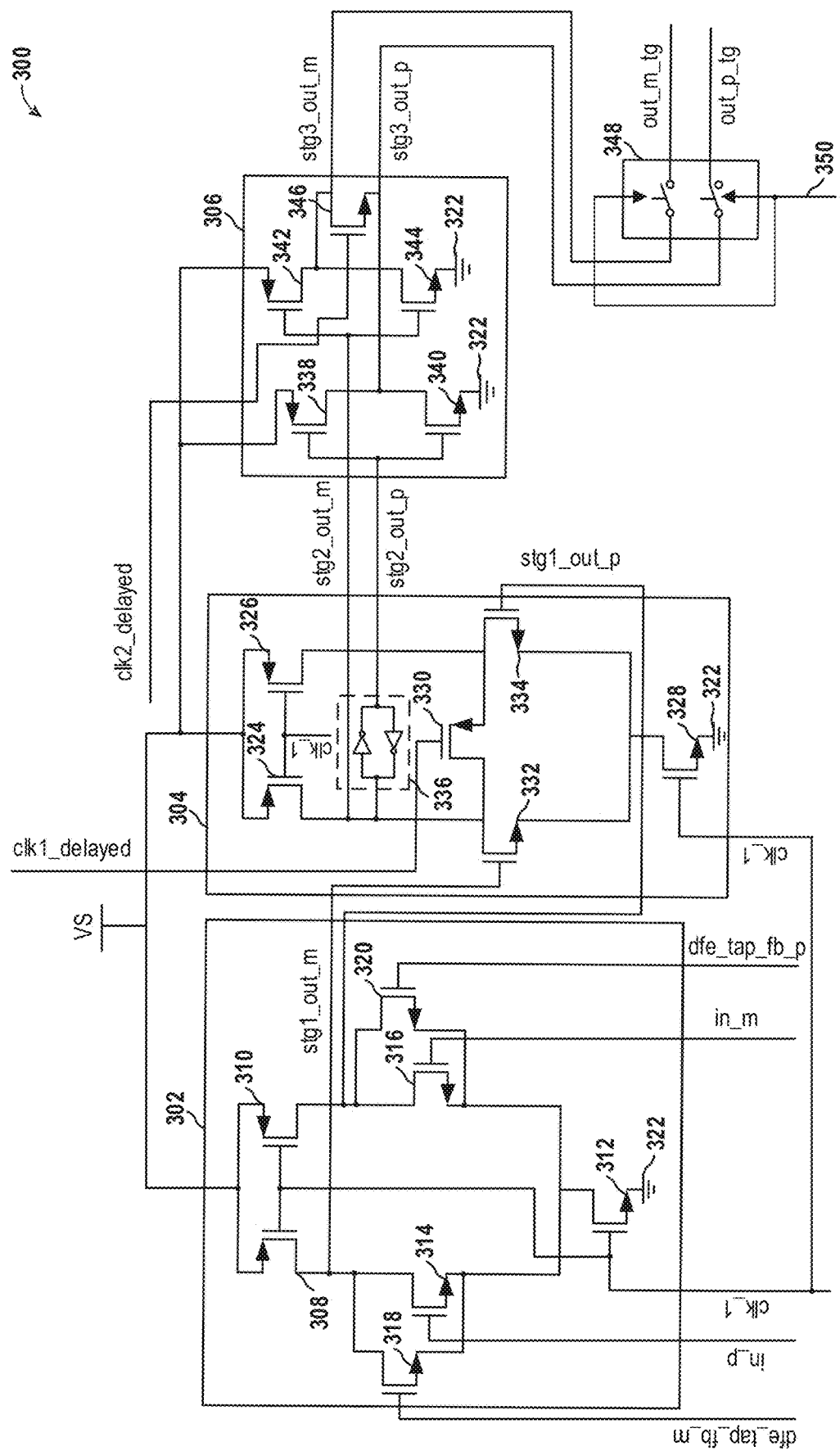
FIG. 3 illustrates an example of a sampler circuit.

FIG. 3 illustrates an example of a sampler circuit 300. In some examples, the sampler circuit 300 can correspond to the sampler circuit 116 and/or 118, as illustrated in FIG. 1 or the sampler circuit 202 and/or 204, as illustrated in FIG. 2.

Thus, in some examples, references can be made to the example of FIGS. 1-2 in the description with respect to FIG. 3. The sampler circuit 300 can be configured to operate in a corresponding clock domain, for example, the clock domain 206, as illustrated in FIG. 2. The sampler circuit 300 includes a first stage 302, a second stage 304, and a third stage 306. In some examples, the first, second, and third stages 302, 304, and 306 can correspond to the first, second, and third stages 226, 228, and 230 of the sampler circuit 202, as illustrated in FIG. 2. Although FIG. 3 illustrates an example wherein the stages 302, 304, and 306 are implemented according to a particular circuit configuration for processing signals, in other examples, a different circuit configuration can be used.

The first stage 302 includes field-effect transistors (FETs) 308, 310, and 312. In some examples, the FETs 308, 310, and 312 can be configured to receive at respective gates a clock signal clk_1. In some examples, the clock signal clk_1 can correspond to the clock signal clk0, which can be generated by a CDR circuit, such as the CDR circuit 114, as illustrated in FIG. 1 or the CDR circuit 214, as illustrated in FIG. 2. As such, in some examples, the clock signal clk_1 can correspond to the clock signal 216, as illustrated in FIG. 2. The first stage 302 can further include main FETs 314 and 316, and auxiliary FETs 318 and 320. As illustrated in FIG. 3, the FETs 308, 310, 312, 314, 316, 318, and 320 of the first stage 302 can be coupled between a voltage source Vs and a low voltage rail, represented as a ground 322 in FIG. 3.

In some examples, during the operation of the receiver, the first stage 302 can be configured to receive a differential data input signal that includes a first data input signal in_p and a second data input signal in_n. The differential data input signal can correspond to the data input signal 224, as illustrated in FIG. 2. As such, in some examples, the differential data input signal can correspond to at least one bit of a stream of bits received at the receiver 104, as illustrated in FIG. 1. In some examples, the first and second data input signals in_p and in_m can be complementary signals of each other. Each main FET 314 and 316 can be configured to receive one of the first and second data input signals in_p or and in_n.

In some examples, during the operation of the receiver, the first stage 302 can be configured to receive a differential capacitive weighted signal that includes a first capacitive weighted signal dfe_tap_fb_m and a second capacitive weighted signal dfe_tap_fb_p. Each auxiliary FET 318 and 320 of the first stage 302 can be configured to receive one of the first and second capacitive weighted signals dfe_tap_fb_m and dfe_tap_fb_p. By way of further example, the differential capacitive weighted signal can correspond to the capacitive weighted signal 120, as illustrated in FIG. 1 or the capacitive weighted signal 232, as illustrated in FIG. 2. In some examples, the first and second capacitive weighted signals dfe_tap_fb_m and dfe_tap_fb_p can be complementary signals of each other.

The first capacitive weighted signal dfe_tap_fb_m and the second capacitive weighted signal dfe_tap_fb_p can be generated by a capacitive coupling feedback circuit, such as the capacitive coupling feedback circuit 122, as illustrated in FIG. 1 or the capacitive coupling feedback circuit 234, as illustrated in FIG. 2. In some examples, the capacitive coupling feedback circuit can be implemented as part of a first feedback path, such as for a first tap, and the first and second capacitive weighted signals dfe_tap_fb_m and dfe_tap_fb_p can be employed to compensate for ISI effects caused by a first previous bit (e.g., the most recent bit n−1) received at the receiver. In some examples, the capacitive coupling feedback circuit can be implemented as part of a second feedback path, such as for a second tap, and the first and second capacitive weighted signals dfe_tap_fb_m and dfe_tap_fb_p can be employed to compensate for ISI effects caused by a second previous bit (e.g., the most recent bit n−2) received at the receiver.

In some examples, the first stage 302 of the sampler circuit 300 can be configured to combine the first and second data input signals in_p and in_n, and the first and second capacitive weighted signals dfe_tap_fb_m and dfe_tap_fb_p to provide a first stage differential signal that includes a pair of first stage output signals stg1_out_m and stg1_out_p. In some examples, the first stage differential signal can correspond to the amplified data signal 236, as illustrated in FIG. 2. Thus, the first stage 302 can be configured to combine the first and second data input signals in_p and in_n and the first and second capacitive weighted signals dfe_tap_fb_m and dfe_tap_fb_p based on the clock signal clk_1, and amplify the resulting combined signal to provide the first stage differential signal. The first stage differential signal can be provided to the second stage 304 of the sampler circuit 300.

In some examples, the second stage 304 includes FETs 324, 326, and 328. In some examples, the FETs 324, 326, and 328 can be configured to receive at respective gates the clock signal clk_1, which can be generated by the CDR circuit. In further examples, the second stage 304 includes a FET 330 that can be configured to receive a clock delayed version of the clock signal clk_1. The clock delayed version of the clock signal clk_1 can be represented in FIG. 3 as clk1_delayed. In some examples, the clock delayed signal clk1_delayed can correspond to the clock signal 218, as illustrated in FIG. 2. Thus, in some examples, the clocked delayed signal clk1_delayed can correspond to the clk0_delayed, which can be generated by the CDR circuit, as described herein.

The second stage 304 further includes FETs 332 and 334 that can be configured to respectively receive one of the first stage output signals stg1_out_m and stg1_out_p. In further examples, the second stage 304 includes a regenerative latch circuit 336 that can include a set of inverters that can be connected back-to-back. The FETs 324, 326, 328, 330, 332, and 334, and the regenerative latch circuit 336 can be coupled between the voltage source Vs and the ground 322 at the second stage 304. During operation, the regenerative latch circuit 336 can be configured to convert (e.g., quantize) the first stage output signals stg1_out_m and stg1_out_p to provide a second stage output differential signal that includes a pair of second stage output signals stg2_out_m and stg2_out_p based on the clock signal clk_1 and the delayed clock signal clk1_delayed.

The third stage 306 can include a first set of FETs 338 and 340 and a second set of FETs 342 and 344. In some examples, the first set of FETs 338 and 340 can be part of the second stage 304. The first and second set of FETs 338, 340, 342, and 344 of the third stage 306 can be coupled between the voltage source Vs and the ground 322 at the third stage 306. The first and second set of FETs 338, 340, 342, and 344 can be configured to provide a third stage differential signal that includes a pair of third stage out signals stg3_out_m and stg3_out_p based on the second stage output signals stg2_out_m and stg2_out_p according to a clock delayed signal clk2_delayed received at a FET 346 of the third stage 306. In some examples, the clock delayed signal clk2_delayed can be a clock delayed version of a second clock signal clk_2 that can be provided to another clock domain for clocking of a sampler circuit operating in the other domain. The other clock domain can be different from the corresponding clock domain in which the sampler circuit 300 can be operating. As an example, the other clock domain can correspond to the clock domain 208, as illustrated in FIG. 2.

In some examples, the sampler circuit 300 can include a set of switches 348. In other examples, the set of switches 348 can be external to the sampler circuit 300. By way of further example, the set of switches 348 can define or can be referred to as a multiplexer, and thus can form part of the multiplexer 210 or 212, as illustrated in FIG. 2. A first switch of the set of switches 348 can be configured to receive the third stage output signal stg3_out_m and a second switch of the set of switches 348 can be to receive the third stage output signal stg3_out_p. The set of switches 348 can be configured to output a differential detected bit signal that includes a pair of detected bit signals out_m_tg and out_p_tg based on a previously detected bit 350. The previously detected bit 350 can correspond to the previously detected bit 244, as illustrated in FIG. 2. In some examples, the detected bit signals out_m_tg and out_p_tg can be stored at a storage circuit, such as the storage circuit 132, as illustrated in FIG. 1. Accordingly, the sampler circuit 300 can be configured to process the data input stream according to the capacitive weighted signal to provide the differential detected bit signal having one of a logical low value or a logical high value.

Figure 4:
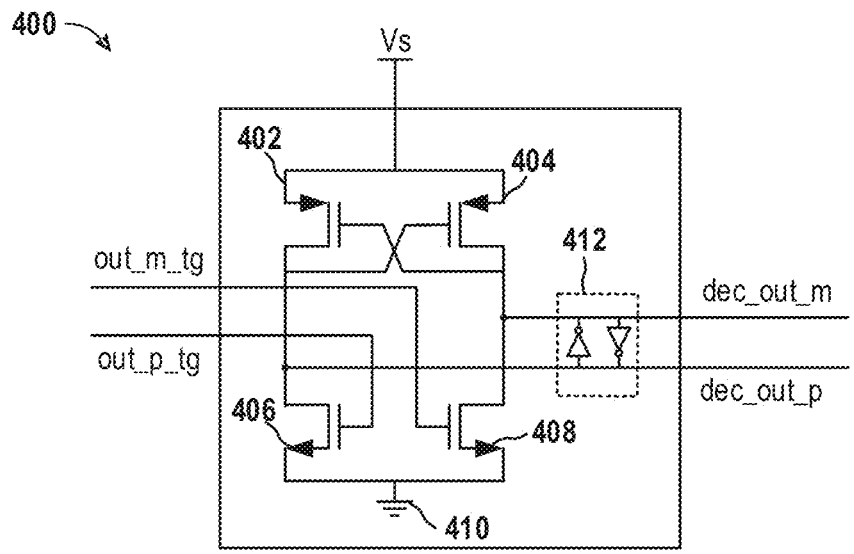
FIG. 4 illustrates an example of a storage circuit.

FIG. 4 illustrates an example of a storage circuit 400. In some examples, the storage circuit 400 can correspond to the storage circuit 132 or the storage circuit 134, as illustrated in FIG. 1. Thus, in some examples, references can be made to the example of FIGS. 1-3 in the description with respect to FIG. 4. As illustrated in FIG. 4, the storage circuit 400 can be configured to receive a pair of detected bit signals out_m_tg and out_p_tg that can be provided by a sampler circuit. In some examples, the sampler circuit can correspond to the sampler circuit 116 and/or 118, as illustrated in FIG. 1, the sampler circuit 202 and/or 204, as illustrated in FIG. 2, or the sampler circuit 300, as illustrated in FIG. 3. Thus, in some examples, the pair of detected bit signals out_m_tg and out_p_tg, as illustrated in FIG. 4 can correspond to the pair of detected bit signals out_m_tg and out_p_tg, as illustrated in FIG. 3. In some examples, the storage circuit 400 can be associated with a respective clock domain, such as the clock domain 206, as illustrated in FIG. 2.

The storage circuit 400 can include a plurality of FETs 402, 404, 406, and 408. The plurality of FETs 402, 404, 406, and 408 can be coupled between a voltage source Vs and a low voltage rail, represented as a ground 410. Respective sources of the FETs 402 and 404 can be coupled to the voltage source Vs. In some examples, the voltage source Vs can correspond to the voltage source Vs, as illustrated in FIG. 3. Respective gates of the FETs 402 and 404 can be cross-coupled to drains of the FETs 402 and 404. The drains of the FETs 402 and 404 can be coupled to drains of the FETs 406 and 408. Respective sources of the FETs 406 and 408 can be coupled to the ground 410. A gate of the FET 406 can be configured to receive the detected bit signal out_p_tg and a gate of the FET 408 can be configured to receive detected bit signal out_m_tg.

In some examples, the storage circuit 400 includes a regenerative latch circuit 412 that can include a set of inverters that can be connected back-to-back. The regenerative latch circuit 412 can be coupled to the drains of the FETs 402 and 406, and to the drains of the FETs 404 and 408. During the operation of the receiver, the regenerative latch circuit 412 can be configured to hold a previously determined state (e.g., the previously detected bit of a corresponding bit, such as the bits n−1, n−2, etc.). In some examples, the previously determined state corresponds to a previously detected differential signal that includes a pair of previously detected bit signals dec_out_m and dec_out_p. In some examples, the previously detected differential signal can be provided to a sampler circuit clocked to operate in a different clock domain with which the storage circuit 400 can be associated.

Figure 5:
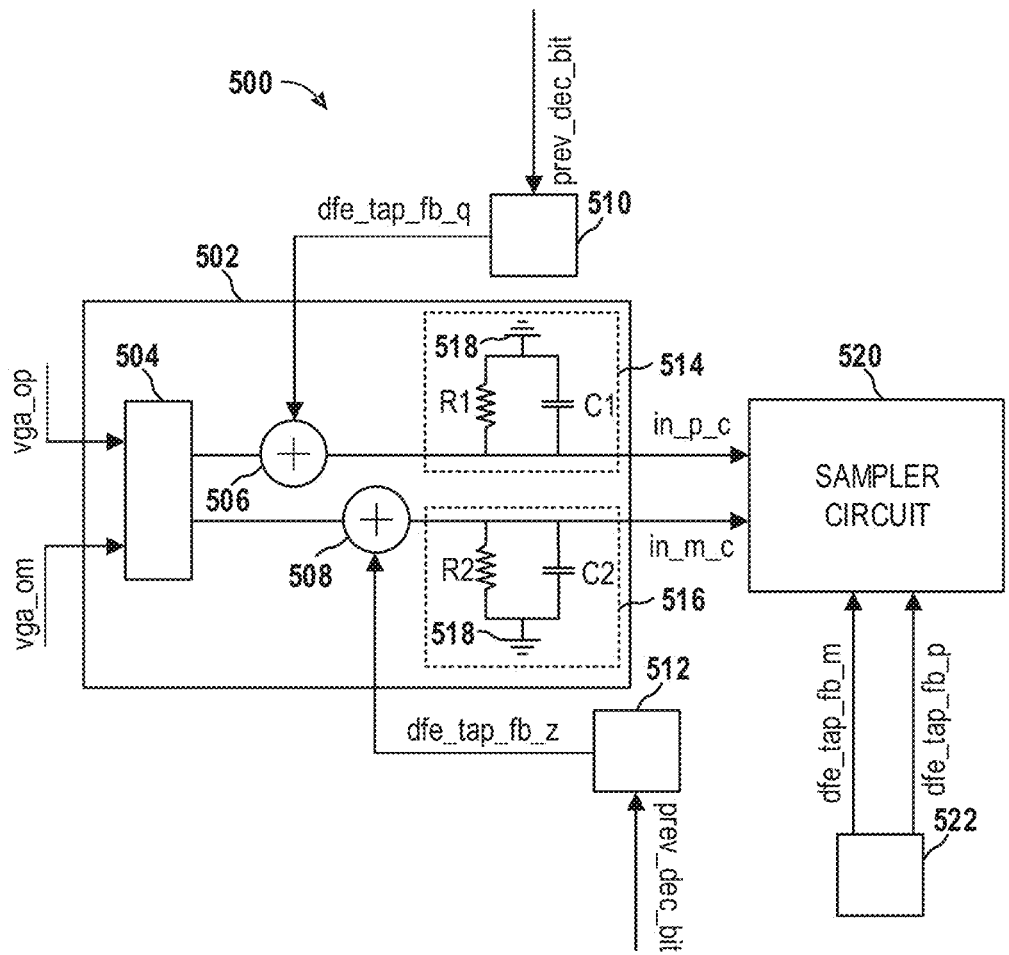
FIG. 5 illustrates an example a system that can be configured to compensate for distortion effects that a previously received bit has on a current bit.

FIG. 5 illustrates an example a system 500 that can be configured to compensate for distortion effects that a previously received bit has on a current bit. In some examples, the system 500 can be implemented in a communication system environment, and thus on a receiver, such as the receiver 104, as illustrated in FIG. 1. The system 500 can be configured to improve a horizontal and vertical eye opening of the receiver, and thus increase an overall quality of the eye diagram for the communication system, thereby improving an accuracy of determining a value of the current bit at a sampler circuit of the receiver.

The system 500 can include a summation circuit 502. The summation circuit 502 can be configured to receive a differential transmitted signal that includes a first transmitted signal vga_op and a second transmitted signal vga_om. In some examples, the differential transmitted signal can be provided from a differential amplifier circuit of the receiver. In some examples, the differential transmitted signal can be provided by a CTLE of the receiver, such as the CTLE 110, as illustrated in FIG. 1. The summation circuit 502 includes a differential input stage 504. The differential input stage 504 can be configured to provide each of the first and second transmitted signals vga_op and vga_om to respective first and second adder circuits 506 and 508.

The first adder circuit 506 can be configured to receive the first transmitted signal vga_op and a first non-capacitive weighted signal dfe_tap_fb_q. The second adder circuit 508 can be configured to receive the second transmitted signal vga_om and a second non-capacitive weighted signal dfe_tap_fb_z. The first non-capacitive weight signal dfe_tap_fb_q can be generated by a first tap generator circuit 510, and the second non-capacitive weighted signal dfe_tap_fb_z can be generated by a second tap generator circuit 512. The first and second non-capacitive weight signals dfe_tap_fb_q and dfe_tap_fb_z can be employed for ISI correction for edges (e.g., transitions) in a received data signal (e.g., a bit of the sequence of bits 108, as illustrated in FIG. 1). Thus, the first and second non-capacitive weight signals dfe_tap_fb_q and dfe_tap_fb_z can be used for data correction in the horizontal eye portion of the eye diagram for the receiver. Each of the first and second tap generator circuits 510 and 512 can be configured to receive a previously decided bit prev_dec_bit of the previous bit received at the receiver and apply a coefficient value (e.g., a positive or negative value) to the previously decided bit prev_dec_bit to weight the previously decided bit prev_dec_bit to generate a corresponding a non-capacitive weighted signal dfe_tap_fb_q and dfe_tap_fb_z.

In some examples, each of the first and second tap generator circuits 510 and 512 can include a digital to analog (DAC) converter programmed with a weight (e.g., the coefficient value) corresponding to a tap. By way of further example, each of the first and second tap generator circuits 510 and 512 can include a polarity selection circuit that can be configured to determine whether the coefficient value (e.g., weight) is added to, or subtracted from, the previously decided bit, in some examples, based on a value of the previously decided bit. Because each of the first and second tap generator circuits 510 and 512 employs the DAC converter to apply the weight to the previously decided bit prev_dec_bit, the weighted version of the previously decided bit prev_dec_bit can be referred to as a non-capacitive weighted signal. Thus, the term non-capacitive weighted signal as used herein can refer to a weighted signal of a previously decided bit that has been generated by a circuit other than a capacitive coupling feedback circuit.

By way of further example, each of the adder circuits 506 and 508 can be coupled to a respective output stage circuit 514 and 516. The first output stage 514 can include a first resistor R1 connected in parallel with a first capacitor C1 with respect to a ground 518. The second output stage 516 can include a second resistor R2 connected in parallel with a second capacitor C2 with respect to the ground 520. Each of the adder circuits 506 and 508 can be configured to combine respective non-capacitive weighted signals dfe_tap_fb_q and dfe_tap_fb_z and respective transmitted signals vga_op and vga_om to provide a partially compensated differential data input signal at the output stage circuits 514 and 516 for input as a differential input signal to a sampler circuit 520. The partially compensated differential data input signal can include a first partially compensated data signal in_p_c and a second partially compensated data signal in_m_c. The first output stage 514 can be configured to output the first partially compensated data signal in_p_c and the second output stage 516 can be configured to output the second partially compensated data signal in_m_c. In some examples, the partially compensated differential data input signal can correspond to the input data signal 224, as illustrated in FIG. 2, or the differential data input signal that includes the data input signals in_p and in_m, as illustrated in FIG. 3.

In some examples, the system 500 can include the sampler circuit 520. The sampler circuit 520 can correspond to the sampler circuit 116 and/or 118, as illustrated in FIG. 1 or the sampler circuit 202 and/or 204, as illustrated in FIG. 2. The sampler circuit 520 can be configured to receive the first partially compensated data signal in_p_c and the second partially compensated data signal in_m_c. In some examples, the sampler circuit 520 can be configured to receive the first and second partially compensated data signals in_p_c and in_m_c at respective input FETs of a first set of FETs. By way of example, the first set of FETs can be part of a first stage of the sampler circuit, such as the first stage 302 of the sampler circuit 300, as illustrated in FIG. 3. Thus, the first set of FETs can correspond to the FETs 314 and 316, as illustrated in FIG. 3. In some examples, the system includes a capacitive coupling feedback circuit 522. The capacitive coupling feedback circuit 522 can correspond to the capacitive coupling feedback circuit 122, as illustrated in FIG. 1, the capacitive coupling feedback circuit 234, as illustrated in FIG. 2, a capacitive coupling feedback circuit 600, as illustrated in FIG. 6, or the capacitive coupling feedback circuit 700, as illustrated in FIG. 7.

The capacitive coupling feedback circuit 522 can include a plurality of capacitors and can be configured to generate a differential capacitive weighted signal corresponding to a weighted detected bit of the previously received bit based on a capacitance of a subset of capacitors of the plurality of capacitors, as described herein. The capacitive coupling feedback circuit 522 can be configured to generate the differential capacitive weighted signal that includes first and second capacitive weighted signals dfe_tap_fb_p and dfe_tap_fb_m to compensate for ISI effects caused by the previously received bit (e.g., the bit n−1, n−2, etc.) at the receiver on the current bit received at the receiver. In some examples, the differential capacitive weighted signal can correspond to the capacitive weighted signal 120, as illustrated in FIG. 1 or the capacitive weighted signal 232, as illustrated in FIG. 2. The first and second capacitive weighted signals dfe_tap_fb_p and dfe_tap_fb_m can be employed for ISI correction in the received data signal (e.g., the bit of the sequence of bits 108, as illustrated in FIG. 1). Thus, the first and second capacitive weighted signals dfe_tap_fb_p and dfe_tap_fb_m can be used for data correction in the vertical eye portion of the eye diagram for the receiver.

In some examples, the sampler circuit 520 can be configured to receive the first and second capacitive weighted signals dfe_tap_fb_p and dfe_tap_fb_m at respective input FETs of a second set of FETs. By way of example, the second set of FETs can be part of the first stage of the sampler circuit, such as the first stage 302 of the sampler circuit 300, as illustrated in FIG. 3. Thus, the second set of FETs can correspond to the FETs 318 and 320, as illustrated in FIG. 3. The sampler circuit 520 can be configured to process the first and second partially compensated data signal in_p_c and in_m_c and the first and second capacitive weighted signals dfe_tap_fb_p and dfe_tap_fb_m to further compensate for the distortion effects that the previously received bit has on the current bit. By combining the summation circuit 502 with the capacitive coupling feedback circuit 522 can improve (e.g., maximize) an overall quality of the eye diagram for the receiver as the horizontal portion of the eye diagram can be improved by the summation circuit 502 and the vertical portion of the eye diagram can be improved by the capacitive coupling feedback circuit 522.

Figure 6:
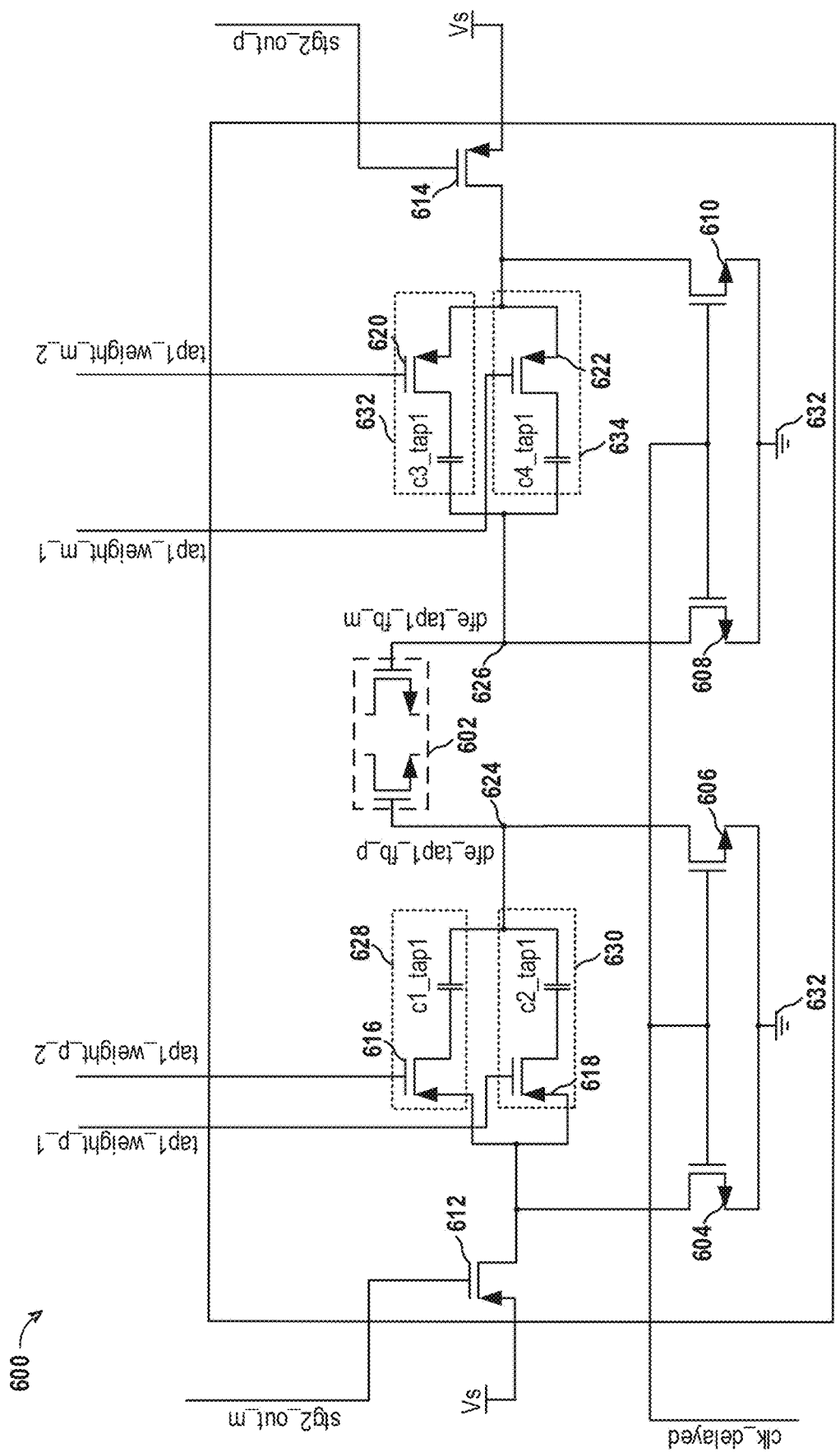
FIG. 6 illustrates an example of a capacitive coupling feedback circuit.
Figure 7:
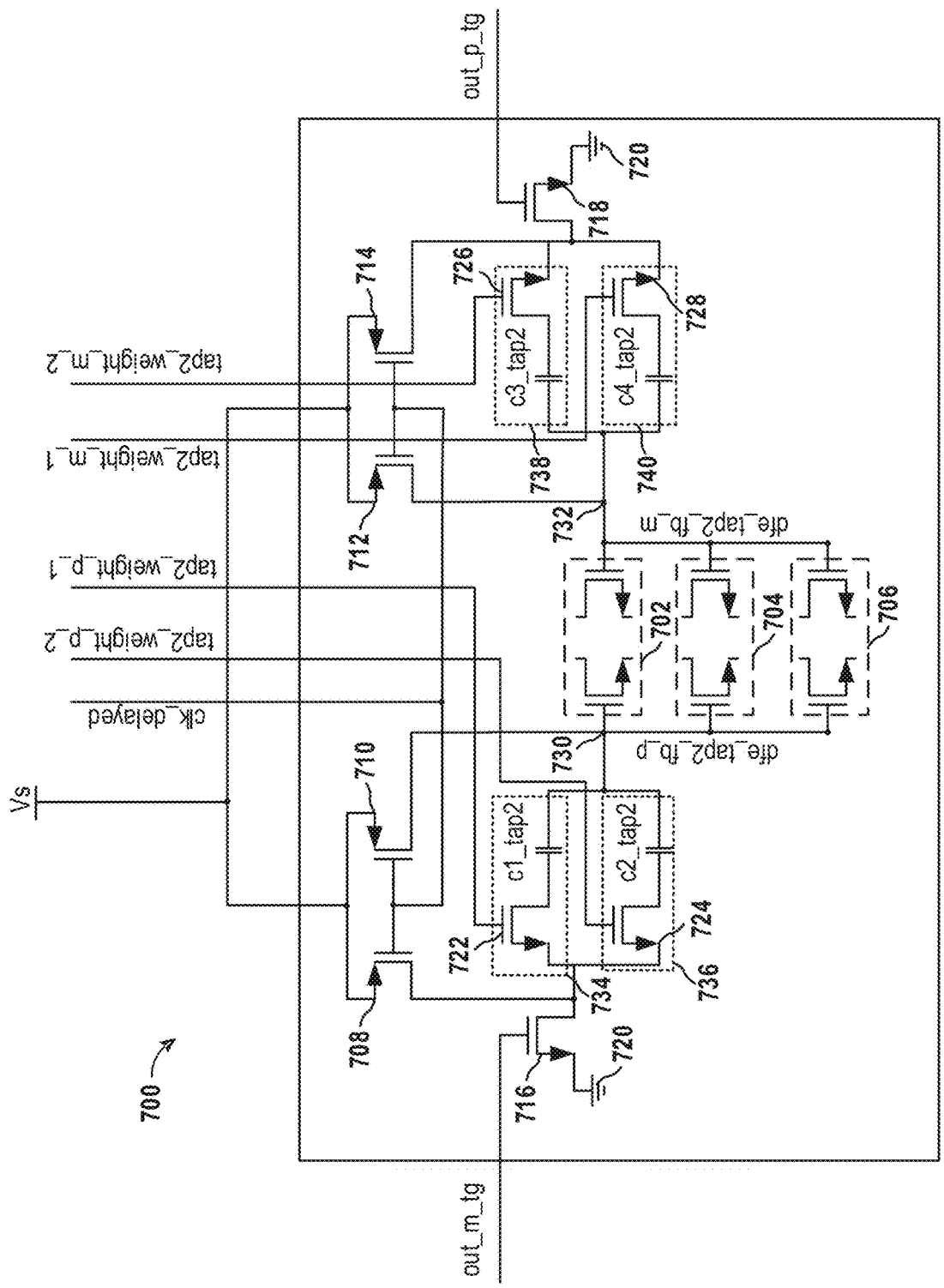
FIG. 7 illustrates an example of another capacitive coupling feedback circuit.

FIG. 6 illustrates an example of a capacitive coupling feedback circuit 600. In some examples, the capacitive coupling feedback circuit 600 can correspond to the capacitive coupling feedback circuit 122, as illustrated in FIG. 1 or the capacitive coupling feedback circuit 234, as illustrated in FIG. 2. Thus, in some examples, references can be made to the example of FIGS. 1-5 in the description with respect to FIG. 6. In some examples, the capacitive coupling feedback circuit 600 can be implemented as part of a first tap feedback path (e.g., the at least one feedback pathö136, as illustrated in FIG. 1). The capacitive coupling feedback circuit 600 can be configured to generate a differential capacitive weighted signal that includes first and second capacitive weighted signals dfe_tap1_fb_p and dfe_tap1_fb_m to compensate for ISI effects caused by a previous bit (e.g., the bit n−1) received at a receiver (e.g., the receiver 104, as illustrated in FIG. 1) on a current bit received at the receiver. In some examples, the differential capacitive weighted signal can correspond to the capacitive weighted signal 120, as illustrated in FIG. 1 or the capacitive weighted signal 232, as illustrated in FIG. 2. In further examples, the first and second capacitive weighted signals dfe_tap1_fb_p and dfe_tap1_fb_m can correspond to the first and second capacitive weighted signal dfe_tap_fb_p and dfe_tap_fb_m, as illustrated in FIG. 3.

In some examples, the differential capacitive weighted signal can be provided to FETs of a sampler circuit 602, such as the sampler circuit 116 and/or 118, as illustrated in FIG. 1, the sampler circuit 202 and/or 204, as illustrated in FIG. 2, or the sampler circuit 300, as illustrated in FIG. 3. In some examples, the FETs of the sampler circuit 602 can correspond to the FETs 318 and 320 of the sampler circuit 300, as illustrated in FIG. 3. Although FIG. 6 illustrates a single sampler circuit 602, in other examples, more than one sampler circuit can be configured to receive the differential capacitive weighted signal. In some examples, an error sampler circuit can be configured to receive the differential capacitive weighted signal.

In some examples, the capacitive coupling feedback circuit 600 includes FETs 604, 606, 608, and 610. The FETs 604, 606, 608, and 610 can be configured to receive at respective gates a clock delayed signal clk_delayed. In some examples, the clock delayed signal clk_delayed can correspond to the clock delayed signal clk270_delayed, which can be generated by a CDR circuit, such as the CDR circuit 114, as illustrated in FIG. 1 or the CDR circuit 214, as illustrated in FIG. 2. In some examples, the clock delayed signal clk_delayed can be a clock delayed version of a respective clock signal that can be provided to a first clock domain (e.g., the clock domain 208, as illustrated in FIG. 2) different from a second clock domain (e.g., the clock domain 206, as illustrated in FIG. 2) to which the differential capacitive weighted signal can be provided.

The capacitive coupling feedback circuit 600 can further include FETs 612 and 614. Respective sources of the FETs 612 and 614 can be configured to receive a source voltage from a voltage source Vs. The capacitive coupling feedback circuit 600 can be configured to receive a second stage output differential signal that includes a pair of second stage output signals stg2_out_m and stg2_out_p. Each gate of the FETs 612 and 614 can be configured to receive a respective one of the second stage output signals stg2_out_m and stg2_out_p. By way of example, the second stage output differential signal can correspond to the quantized data signal 248, as illustrated in FIG. 2. In some examples, the second stage output differential signal can be provided from an output of a second stage (e.g., the second stage 228, as illustrated in FIG. 2) of the sampler circuit (e.g., the sampler circuit 204, as illustrated in FIG. 2) operating in the first clock domain. In some examples, the second stage output signals stg2_out_m and stg2_out_p can correspond to the second stage output signals stg2_out_m and stg2_out_p, as illustrated in FIG. 3.

In some examples, the capacitive coupling feedback circuit 600 includes FETs 616, 618, 620, and 622. In some examples, the drains of the FETs 604 and 610 can be coupled to the drains of the FETs 612 and 614, and the sources of the FETs 616, 618, 620, and 622. A drain of the FET 612 can be coupled to respective sources of the FETs 616 and 618, and a drain of the FET 614 can be coupled to respective sources of the FETs 620 and 622. A gate of each of the FETs 616, 618, 620, and 622 can be configured to receive a respective tap weight signal tap1_weight_p_1, tap1_weight_p_2, tap1_weight_m_1, tap1_weight_m_2 to control generation of the first and second capacitive weighted signals dfe_tap1_fb_p and dfe_tap1_fb_m at respective nodes 624 and 626. In some examples, each respective tap weight signal tap1_weight_p_1, tap1_weight_p_2, tap1_weight_m_1, and tap1_weight_m_2 can be generated by a controller (not shown in FIG. 6). As such, the gate of each of the FETs 616, 618, 620, and 622 can be coupled to the controller to receive the respective tap1_weight_p_1, tap1_weight_p_2, tap1_weight_m_1, and tap1_weight_m_2.

The capacitive coupling feedback circuit 600 can include capacitors c1_tap1, c2_tap1, c3_tap1, and c4_tap1. The capacitor c1_tap1 can be configured in parallel with the capacitor c2_tap1, and the capacitor c3_tap1 can be configured in parallel with the capacitor c4_tap1. The capacitors c1_tap1 and c2_tap1 can be coupled to a respective drain of the FETs 616 and 618, to a drain of the FET 606, and the sampler circuit 602. The capacitors c3_tap1 and c4_tap1 can be coupled to respective drains of the FETs 620 and 622, to a drain of the FET 610, and the sampler circuit 602. Each respective FET that receives a corresponding tap weight signal connected in series with a capacitor can define a cap circuit. Thus, in some examples, the FET 616 that is connected in series with the capacitor c1_tap1 can define a first cap circuit 628, the FET 618 that is connected in series with the capacitor c2_tap1 can define a second cap circuit 630, the FET 620 that is connected in series with the capacitor c3_tap1 can define a third cap circuit 632, and the FET 622 that is connected in series with the capacitor c4_tap1 can define a fourth cap circuit 634.

The first and second cap circuits 628 and 630 can be selectively controlled (e.g., enabled to contribute to an overall capacitance that is based on the first and second cap circuits 628 and 630) based on a corresponding tap weight signal (e.g., the tap1_weight_p_1 and the tap1_weight_p_2) to control an amount of weight applied to provide the capacitive weighted signal dfe_tap1_fb_p. The third and fourth cap circuits 632 and 634 can be selectively controlled (e.g., enabled to contribute to an overall capacitance that is based on the third and fourth cap circuits 632 and 634) based on a corresponding tap weight signal (e.g., the tap1_weight_p_1 and the tap1_weight_p_2) to control an amount of weight applied to provide the capacitive weighted signal dfe_tap1_fb_m. A respective overall capacitance of the first and second cap circuits 628 and 630 and the third and fourth cap circuits 632 and 634 can be a sum of capacitances of the respective capacitors of a parallel-connected pair of cap circuits. Accordingly, the number of cap circuits and thus the number of capacitors of the capacitors that are connected in parallel can be based on the amount of weight that may be needed to compensate for ISI effects caused by a previous bit (e.g., the bit n−1) on the current bit received at the receiver.

For clarity and brevity purposes, FIG. 6 illustrates two cap circuits 628 and 630 for generating the capacitive weighted signal dfe_tap1_fb_p and two cap circuits 632 and 634 for generating the capacitive weighted signal dfe_tap1_fb_m. However, in other examples, more than two cap circuits can be employed for generating each respective capacitive weighted signals dfe_tap1_fb_p and dfe_tap1_fb_m. Thus, in some examples, a subset of cap circuits of a first group of cap circuits can be connected in parallel based on a corresponding tap weight signal to control the amount of weight applied to provide the first capacitive weighted signal dfe_tap1_fb_p. In further examples, a subset of cap circuits of a second group of cap circuits can be connected in parallel based on a corresponding tap weight signal to control the amount of weight applied to provide the second capacitive weighted signal dfe_tap1_fb_m.

In some examples, at least one capacitor of the capacitors c1_tap1, c2_tap1 and at least one capacitor of the capacitors c3_tap1 and c4_tap1 can be implemented as variable capacitors. Each of the capacitors c1_tap1 and c3_tap1 (and/or the c2_tap1 and c4_tap1, in some examples) can be tuned to adjust a respective capacitance value. In some examples, an adaption algorithm (e.g., executing on the controller) can be configured to determine an amount of capacitance for each of the capacitors c1_tap1, c2_tap1, c3_tap1, and/or c4_tap1 to set capacitance values of the capacitors. In some examples, the capacitance of each of the capacitors c1_tap1, c2_tap1, c3_tap1, and/or c4_tap1 can be adjusted manually to set the capacitance values capacitors.

By way of example, during the operation of the receiver, the first capacitive weighted signal dfe_tap1_fb_p can be generated based on the number of cap circuits of the first group of cap circuits that are connected in parallel to control an amount of weight applied to provide the first capacitive weighted signal dfe_tap1_fb_p. In some examples, two cap circuits such as the cap circuits 628 and 630 of the first group of cap circuits are connected in parallel. Thus, the first capacitive weighted signal dfe_tap1_fb_p can be generated based on the capacitance of the capacitors c1_tap1 and c2_tap1 and the second stage output signal stg2_out_m according to the clock delayed signal clk_delayed. For example, the FET 612 can be configured to receive the second stage output signal stg2_out_m and the FETs 604 and 606 can be configured to receive the clock delayed signal clk_delayed. The FET 612 can be configured to provide the source voltage from the voltage source Vs to the first and second cap circuits 628 and 630 in response to the second stage output signal stg2_out_m. The FETs 604 and 606 can be configured to provide a path for current to flow to a ground 636 and thus to allow for charging storage at respective capacitors c1_tap1 and c2_tap1. The FETs 616 and 618 can be configured to receive respective tap weight signals tap1_weight_p_1 and tap1_weight_p_2 to enable storing of the charge at respective capacitors c1_tap1 and c2_tap1 of the cap circuits 628 and 630. The first capacitive weighted signal dfe_tap1_fb_p can be generated at the output node 624 based on the charged stored at the capacitors c1_tap1 and c2_tap1 and the capacitances of the capacitors c1_tap1 and c2_tap1.

By way of example, during the operation of the receiver, the second capacitive weighted signal dfe_tap1_fb_m can be generated based on the number of cap circuits of the second group of cap circuits that are connected in parallel to control the amount of weight applied to provide the second capacitive weight signal dfe_tap1_fb_m. In some examples, two cap circuits such as the cap circuits 632 and 634 of the second group of cap circuits are connected in parallel. Thus, the second capacitive weighted signal dfe_tap1_fb_m can be generated based on the capacitance of the capacitors c3_tap1 and c4_tap1 and the second stage output signal stg2_out_p according to the clock delayed signal clk_delayed.

For example, the FET 614 can be configured to receive the second stage output signal stg2_out_p and the FETs 608 and 610 can be configured to receive the clock delayed signal clk_delayed. The FET 614 can be configured to provide the source voltage from the voltage source Vs to the first and second cap circuits 632 and 634 in response to the second stage output signal stg2_out_p. The FETs 608 and 610 can be configured to provide a path for current to flow to the ground 636 and thus to allow for charging storage at respective capacitors c3_tap1 and c4_tap1. The FETs 620 and 622 can be configured to receive respective tap weight signals tap1_weight_m_1 and tap1_weight_m_2 to enable storing of the charge at respective capacitors c3_tap1 and c4_tap1 of the cap circuits 632 and 634. The second capacitive weighted signal dfe_tap1_fb_m can be generated at the output node 626 based on the charged stored at the capacitors c3_tap1 and c4_tap1 and the capacitances of the capacitors c3_tap1 and c4_tap1.

By way of example, during a logical high value of the clock signal clk_delayed for a given clock cycle, the first and second capacitive weighted signals dfe_tap1_fb_p and dfe_tap1_fb_m can be provided to the sampler circuit 602. In some examples, as described herein, the sampler circuit 602 (e.g., a slicer circuit) can be configured to sample a data input signal (e.g., the data input signal 224, as illustrated in FIG. 2) corresponding to a current bit received at the receiver. At about a sample time at which the slicer samples (e.g., detects) the data input signal, the clock signal clk_delayed can have a logical low value to disconnect the output nodes 624 and 626 from the ground 636. Respective sources of the FETs 604, 606, 608, and 610 can be coupled to the ground 636 and thus couple the output nodes 624 and 626 to the ground 636 during the logical high value of the clock signal clk_delayed for the given clock cycle. In some examples, during a logical high value of the clock signal clk_delayed for a subsequent clock cycle, the output nodes 624 and 626 can be reset by coupling the output nodes 624 and 626 to the ground 636. Accordingly, by resetting the output nodes 624 and 626, the first and second capacitive weighted signals dfe_tap1_fb_p and dfe_tap1_fb_m can be reset every UI and thus dependence of DFE feedback settling time on CIDs can be reduced.

Accordingly, by implementing the capacitive coupling feedback circuit 600 as part of the first tap feedback path can improve a closed-loop timing of the first tap feedback path. As such, the first and second capacitive weighted signals dfe_tap1_fb_p and dfe_tap1_fb_m can settle at a greater rate in contrast to other DFE techniques for the first tap feedback path, thereby improving a bit sampling accuracy of the sampler circuit.

FIG. 7 illustrates an example of a capacitive coupling feedback circuit 700. In some examples, the capacitive coupling feedback circuit 700 can correspond to the capacitive coupling feedback circuit 122, as illustrated in FIG. 1 or the capacitive coupling feedback circuit 234, as illustrated in FIG. 2. Thus, in some examples, references can be made to the example of FIGS. 1-6 in the description with respect to FIG. 7. In some examples, the capacitive coupling feedback circuit 700 can be implemented as part of a second tap feedback path. In other examples, the capacitive coupling feedback circuit 700 can be implemented as part of one of a third tap feedback path, a fourth tap feedback path, etc.

The capacitive coupling feedback circuit 700 can be configured to generate a differential capacitive weighted signal that includes first and second capacitive weighted signals dfe_tap2_fb_p and dfe_tap2_fb_m to compensate for ISI effects caused by a previous bit (e.g., the bit n−2) received at a receiver (e.g., the receiver 104, as illustrated in FIG. 1) on a current bit received at the receiver. In some examples, the differential capacitive weighted signal can correspond to the capacitive weighted signal 120, as illustrated in FIG. 1 or the capacitive weighted signal 232, as illustrated in FIG. 2. In further examples, the first and second capacitive weighted signals dfe_tap2_fb_p and dfe_tap2_fb_m can correspond to the first and second capacitive weighted signal dfe_tap_fb_p and dfe_tap_fb_m, as illustrated in FIG. 3, or the first and second capacitive weighted signals dfe_tap_fb_p and dfe_tap_fb_m, as illustrated in FIG. 4.

In some examples, the differential capacitive weighted signal can be provided to a sampler circuit 702 operating in a respective clock domain (e.g., the clock domain 206, as illustrated in FIG. 2). The sampler circuit 702 can correspond to the sampler circuit 116 and/or 118, as illustrated in FIG. 1, the sampler circuit 202 and/or 204, as illustrated in FIG. 2, or the sampler circuit 300, as illustrated in FIG. 3. In some examples, the FETs of the sampler circuit 702 can correspond to the FETs 318 and 320 of the sampler circuit 300, as illustrated in FIG. 3 or the FETs 414 and 416 of the first stage 400 of a corresponding sampler circuit.

In some examples, the sampler circuit 702 is a first sampler circuit 702, and the differential capacitive weighted signal can be provided to a second sampler circuit 704 operating in the respective clock domain as the first sampler circuit 702. In some examples, the first and second sampler circuits 702 and 704 are implemented according to a loop unrolled architecture. The differential capacitive weighted signal can be provided to each of the first and second sampler circuits 702 and 704 operating in the respective clock domain. As such, in some implementations, the capacitive coupling feedback circuit 700 can be shared among the sampler circuits 702 and 704 of the respective clock domain. In additional or alternative examples, an error sampler circuit 706 can be configured to operate in the respective clock domain. Because the capacitive coupling feedback circuit 700 can be shared, in some examples, the differential capacitive weighted signal can be provided to the sampler circuits 702 and 704, and to the error sampler circuit 706.

In some examples, the capacitive coupling feedback circuit 700 includes FETs 708, 710, 712, and 714. The FETs 708, 710, 712, and 714 can be configured to receive at respective gates a clock delayed signal clk_delayed. In some examples, the clock delayed signal clk_delayed can correspond to the clock delayed signal clk2_delayed, as illustrated in FIG. 3. In some examples, the clock delayed signal clk_delayed can correspond to the clock delayed signal clk180_delayed, which can be generated by a CDR circuit, such as the CDR circuit 114, as illustrated in FIG. 1 or the CDR circuit 214, as illustrated in FIG. 2. By way of further example, the clock delayed signal clk_delayed can correspond to the clock signal 220, as illustrated in FIG. 2. In some examples, the clock delayed signal clk_delayed can be a clock delayed version of a respective clock signal that can be provided to a first clock domain (e.g., the clock domain 208, as illustrated in FIG. 2) different from a second clock domain (e.g., the clock domain 206, as illustrated in FIG. 2) to which the differential capacitive weighted signal can be provided. In some examples, respective sources of the FETs 708, 710, 712, and 714 can be coupled to a voltage source Vs to receive a source voltage.

The capacitive coupling feedback circuit 700 can be configured to receive a differential detected bit signal that includes a pair of detected bit signals out_m_tg and out_p_tg from an output of a sampler circuit (e.g., the sampler circuit 204, as illustrated in FIG. 2) operating in the first clock domain (e.g., the clock-270 domain). Each gate of the FETs 716 and 718 can be configured to receive respectively the detected bit signals out_m_tg and out_p_tg. Although FIG. 7 illustrates the capacitive coupling feedback circuit 700 receiving the differential detected bit signal at respective gates of the FETs 716 and 718, in other examples, a differential third stage output signal can be received. The differential third stage output signal can correspond to the third stage output signal 250, as illustrated in FIG. 2. In some examples, the differential detected bit signal can correspond to the second detected bit 130, as illustrated in FIG. 1 or the detected bit signal 252, as illustrated in FIG. 2. A source of each of the FETs 716 and 718 can be coupled to a ground 720. Respective drains of each of the FETs 716 and 718 can be coupled to corresponding drains of the FET 708 and the FET 714.

In some examples, the capacitive coupling feedback circuit 700 includes FETs 722, 724, 726, and 728. Respective sources of each of the FETs 722, 724, 726, and 728 can be coupled to one of the drains of the FETs 716 and 718. A gate of each of the FETs 722, 724, 726, and 728 can be configured to receive a respective tap weight signal tap2_weight_p_1, tap2_weight_p_2, tap2_weight_m_1, and tap2_weight_m_2 to control generation of the first and second capacitive weighted signals dfe_tap2_fb_p and dfe_tap2_fb_m at respective output nodes 730 and 732. In some examples, each respective tap weight signal tap2_weight_p_1, tap2_weight_p_2, tap2_weight_m_1, and tap2_weight_m_2 can be generated by a controller (not shown in FIG. 7). As such, the gate of each of the FETs 722, 724, 726, and 728 can be coupled to the controller to receive the respective tap2_weight_p_1, tap2_weight_p_2, tap2_weight_m_1, and tap1_weight_m_2.

The capacitive coupling feedback circuit 700 can include capacitors c1_tap2, c2_tap2, c3_tap2, and c4_tap2. The capacitor c1_tap2 can be configured in parallel with the capacitor c2_tap2, and the capacitor c3_tap2 can be configured in parallel with the capacitor c4_tap2. The capacitors c1_tap2 and c2_tap2 can be coupled to respective drains of the FETs 722 and 724, to a drain of the FET 710, and to each of the sampler circuits 702 and/or the error sampler circuit 706. The capacitors c3_tap2 and c4_tap2 can be coupled to respective drains of the FETs 726 and 728, to a drain of the FET 714, and to each of the sampler circuits 702 and/or the error sampler circuit 706. In some examples, the FET 722 can be connected in series with the capacitor c1_tap2 and can define a first cap circuit 734, the FET 724 can be connected in series with the capacitor c2_tap2 and can define a second cap circuit 736, the FET 726 can be connected in series with the capacitor c3_tap2 and can define a third cap circuit 738, and the FET 728 can be connected in series with the capacitor c4_tap2 and can define a fourth cap circuit 740.

In some examples, the first and second cap circuits 734 and 736 can be selectively controlled (e.g., enabled to contribute to an overall capacitance that is based on the first and second cap circuits 734 and 736) based on a corresponding tap weight signal (e.g., the tap2_weight_p_1 and the tap2_weight_p_2) to control an amount of weight applied to provide the dfe_tap2_fb_p. The third and fourth cap circuits 738 and 740 can be selectively controlled (e.g., enabled to contribute to an overall capacitance based on the third and fourth cap circuits 738 and 740) based on a corresponding tap weight signal (e.g., the tap2_weight_m_1 and the tap2_weight_m_2) to control an amount of weight applied to provide the capacitive weighted signal dfe_tap2_fb_m. A respective overall capacitance of the first and second cap circuits 734 and 736 and the third and fourth cap circuits 738 and 740 can be a sum of capacitances of the respective capacitors of a parallel-connected pair of cap circuits. Accordingly, the number of cap circuits and thus the number of capacitors of the capacitors that are connected in parallel can be based on the amount of weight that may be needed to compensate for ISI effects caused by the previous bit (e.g., the bit n 2) on the current bit received at the receiver.

For clarity and brevity purposes, FIG. 7 illustrates two cap circuits 722 and 736 for generating the capacitive weighted signal dfe_tap2_fb_p and two cap circuits 738 and 740 being employed for generating the capacitive weighted signal dfe_tap1_fb_m. However, in other examples, more than two cap circuits can be employed for generating each respective capacitive weighted signal dfe_tap2_fb_p and dfe_tap2_fb_m. Thus, in some examples, a subset of cap circuits of a first group of cap circuits can be connected in parallel based on a corresponding tap weight signal to control an amount of weight applied to provide the first capacitive weighted signal dfe_tap2_fb_p. In further examples, a subset of cap circuits of a second group of cap circuits can be connected in parallel based on a corresponding tap weight signal to control an amount of weight applied to provide the second capacitive weighted signal dfe_tap2_fb_m.

In some examples, at least one capacitor of the capacitors c1_tap2, c2_tap2, and at least one capacitor of the capacitors c3_tap2 and c4_tap2 can be implemented as variable capacitors. Each of the capacitors c1_tap2 and c3_tap2 (and/or the c2_tap2 and c4_tap2, in some examples) can be tuned to adjust a respective capacitance value. In some examples, an adaption algorithm (e.g., executing on the controller) can be configured to determine an amount of capacitance for each of the capacitors c1_tap2, c2_tap2, c3_tap2, and/or c4_tap2 to set capacitance values of the capacitors. In some examples, the capacitance of each of the capacitors c1_tap2, c2_tap2, c3_tap2, and/or c4_tap2 can be adjusted manually to set the capacitance values capacitors.

In some examples, during the operation of the receiver, the first capacitive weighted signal dfe_tap2_fb_p can be generated based on the number of cap circuits of the first group of cap circuits that are connected in parallel to control the amount of weight applied to provide the dfe_tap2_fb_p. In some examples, two cap circuits such as the cap circuits 734 and 736 of the first group of cap circuits are connected in parallel. Thus, the first capacitive weighted signal dfe_tap2_fb_p can be generated based on the capacitance of the capacitors c1_tap2 and c2_tap2, and the detected bit signal out_m_tg according to the clock delayed signal clk_delayed. For example, the FET 716 can be configured to receive the detected bit signal out_m_tg and the FETs 708 and 710 can be configured to receive the clock delayed signal clk_delayed. The FETS 708 and 710 can be configured to provide the source voltage from the voltage source Vs to the cap circuits 734 and 736 in response to receiving the clock delayed signal clk_delayed. The FET 716 can be configured to provide a current path for a current to flow through the respective capacitors c1_tap2 and c2_tap2 and thus enable storing of a charge at the respective capacitors c1_tap2 and c2_tap2 by coupling the cap circuits 734 and 736 to the ground 720. In some examples, the FETs 722 and 724 can be configured to receive respective tap weight signals tap2_weight_p_1 and tap2_weight_p_2 to store charge at respective capacitors c1_tap2 and c2_tap2 based on the source voltage from the voltage source Vs. The first capacitive weighted signal dfe_tap2_fb_p can be generated at the output node 730 based on the charged stored at the capacitors c1_tap2 and c2_tap2 and the capacitances of the capacitors c1_tap2 and c2_tap2 according to the clock delayed signal clk_delayed.

In some examples, during the operation of the receiver, the second capacitive weighted signal dfe_tap2_fb_m can be generated based on the number of cap circuits of the second group of cap circuits that are connected in parallel to control the amount of weight applied to provide the dfe_tap2_fb_m. In some examples, two cap circuits such as the cap circuits 738 and 740 of the second group of cap circuits are connected in parallel. Thus, the second capacitive weighted signal dfe_tap2_fb_m can be generated based on the capacitance of the capacitors c3_tap2 and c4_tap2, and the detected bit signal out_p_tg according to the clock delayed signal clk_delayed.

For example, the FET 718 can be configured to receive the detected bit signal out_p_tg and the FETs 712 and 714 can be configured to receive the clock delayed signal clk_delayed. The FETS 712 and 714 can be configured to provide the source voltage from the voltage source Vs to the cap circuits 738 and 740 in response to receiving the clock delayed signal clk_delayed. The FET 718 can be configured to provide a current path for a current to flow through the respective capacitors c3_tap2 and c4_tap2 and thus enable storing of a charge at the respective capacitors c3_tap2 and c4_tap2 by coupling the cap circuits 738 and 740 to the ground 720. In some examples, the FETs 726 and 726 can be configured to receive respective tap weight signals tap2_weight_m_1 and tap2_weight_m_2 to store charge at respective capacitors c3_tap2 and c4_tap2 based on the source voltage from the voltage source Vs. The second capacitive weighted signal dfe_tap2_fb_m can be generated at the output node 732 based on the charged stored at the capacitors c3_tap2 and c4_tap2 and the capacitances of the capacitors c3_tap2 and c4_tap2 according to the clock delayed signal clk_delayed.

By way of further example, during a logical high value of the clock signal clk_delayed for a given clock cycle, the first and second capacitive weighted signals dfe_tap2_fb_p and dfe_tap2_fb_m can be provided to a respective sampler circuit (e.g., the sampler circuit 702 or 704). In some examples, as described herein, the respective sampler circuit (e.g., slicer circuit) can be configured to sample a data input signal (e.g., the data input signal 224, as illustrated in FIG. 2) corresponding to the current bit received at the receiver. At about a sample time at which the slicer samples (e.g., detects) the data input signal, the clock signal clk_delayed can have a logical low value to disconnect the output nodes 730 and 732 from the voltage source Vs. In some examples, during a logical high value of the clock signal clk_delayed for a subsequent clock cycle, the output nodes 730 and 732 can be reset by coupling the output nodes 730 and 732 to the voltage source Vs. Accordingly, by resetting the output nodes 730 and 732, the first and second capacitive weighted signals dfe_tap2_fb_p and dfe_tap2_fb_m can be reset every UI and thus dependence of DFE feedback settling time on CIDs can be reduced.

Accordingly, by implementing the capacitive coupling feedback circuit 700 as part of the second tap feedback path or in some examples as part of a non-first tap feedback path can improve a closed-loop timing of the second tap feedback path or the non-first tap feedback path. As such, the first and second capacitive weighted signals dfe_tap2_fb_m and dfe_tap2_fb_p can settle at a greater rate in contrast to other DFE techniques for the second tap feedback path or the non-first tap feedback path, thereby improving a bit sampling accuracy of the sampler circuit.

Figure 8:
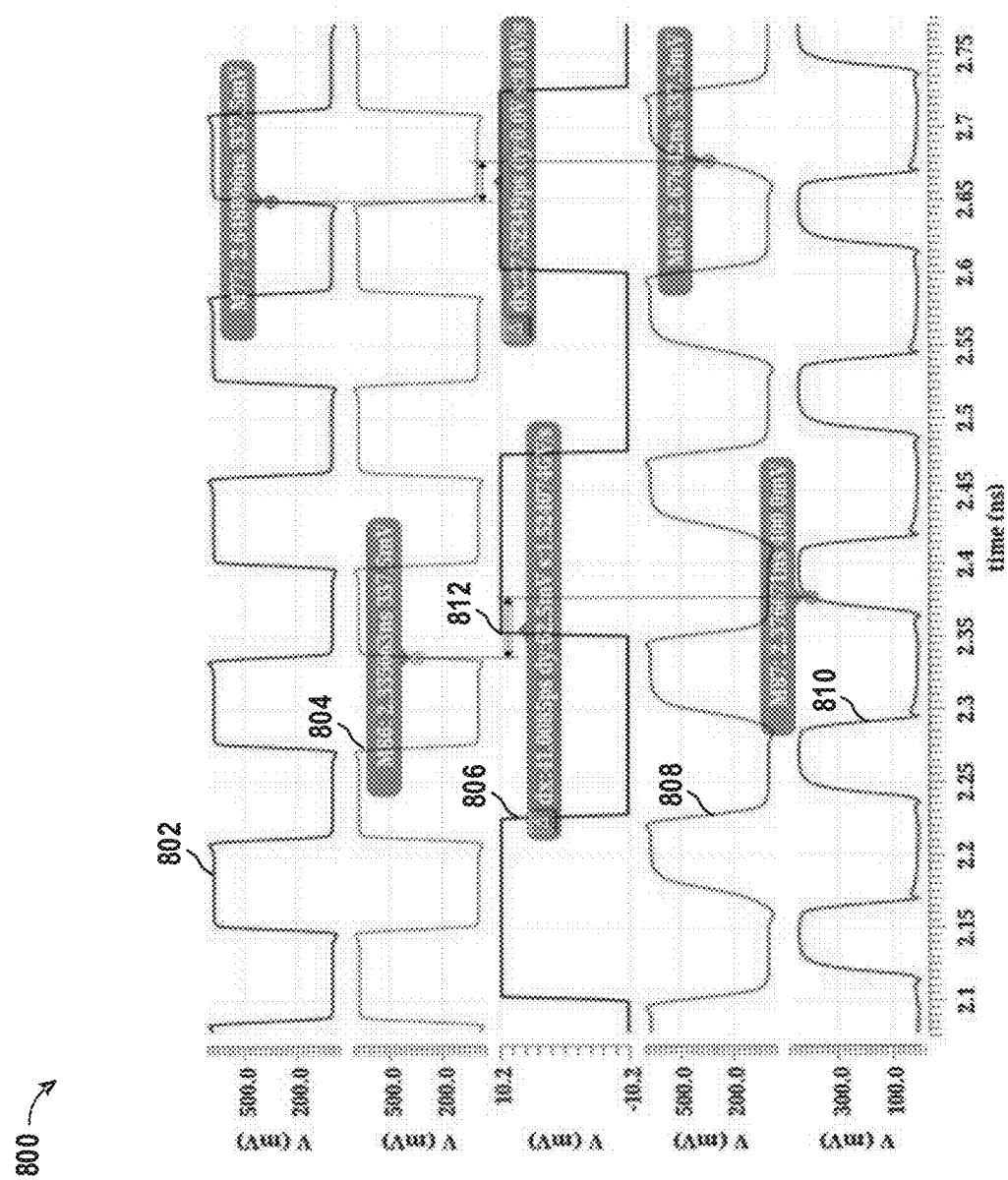
FIG. 8 illustrates an example of a signal diagram associated with an operation of a sampler circuit.

FIG. 8 illustrates an example of a signal diagram 800 associated with an operation of a sampler circuit. In some examples, the sampler circuit can correspond to the sampler circuit 116 or 118, as illustrated in FIG. 1 or the sampler circuit 202 or 204, as illustrated in FIG. 2, or the sampler circuit 300, as illustrated in FIG. 3. Thus, in some examples, references can be made to the example of FIGS. 1-7 in the description with respect to FIG. 8.

As illustrated in the example of FIG. 8, a y-axis of the signal diagram 800 can represent a voltage (V) in millivolts (mV) and an x-axis of the signal diagram 800 can represent a time (t) in nanoseconds (ns). The signal diagram 800 includes a clock signal 802, a clock signal 804, a differential data input signal 806, a differential stage output signal 808, and a differential capacitive weighted signal 810. In some examples, the clock signal 802 can correspond to the clock signal clk_1 (e.g., the clock signal clk0), as illustrated in FIG. 3. In further examples, the clock signal 804 can correspond to the clock delayed signal clk2_delayed (e.g., the clock delayed clk180_delayed), as illustrated in FIG. 3. The differential data input signal 806 can be representative of a difference between the data input signal in_p and the data input signal in_n, for example, as illustrated in FIG. 3. The differential stage output signal 808 can correspond to a third stage differential signal. Thus, the differential stage output signal 808 can be representative of a difference between the third stage out signals stg3_out_m and stg3_out_p, as illustrated in FIG. 3.

In some examples, the differential capacitive weighted signal 810 can be representative of a difference between the capacitive weighted signal dfe_tap_fb_p and the capacitive weighted signal dfe_tap_fb_m, as illustrated in FIGS. 3 and 4, or between the capacitive weighted signal dfe_tap2_fb_p and the second capacitive weighted signal dfe_tap2_fb_m, as illustrated in FIG. 7. By implementing the capacitive coupling feedback circuit described herein as part of a tap feedback path, such as a second tap feedback path, the differential capacitive weighted signal 810 can settle in about 1.3 UI corresponding to 41 picoseconds (ps), which is illustrated as 812 in the example of FIG. 8. Thus, the implementation of the capacitive coupling feedback circuit in the second tap feedback path enables the differential capacitive weighted signal 810 to settle within about 1.3 UI, such that accurate decision making can be implemented at the sampler circuit.

Figure 9:
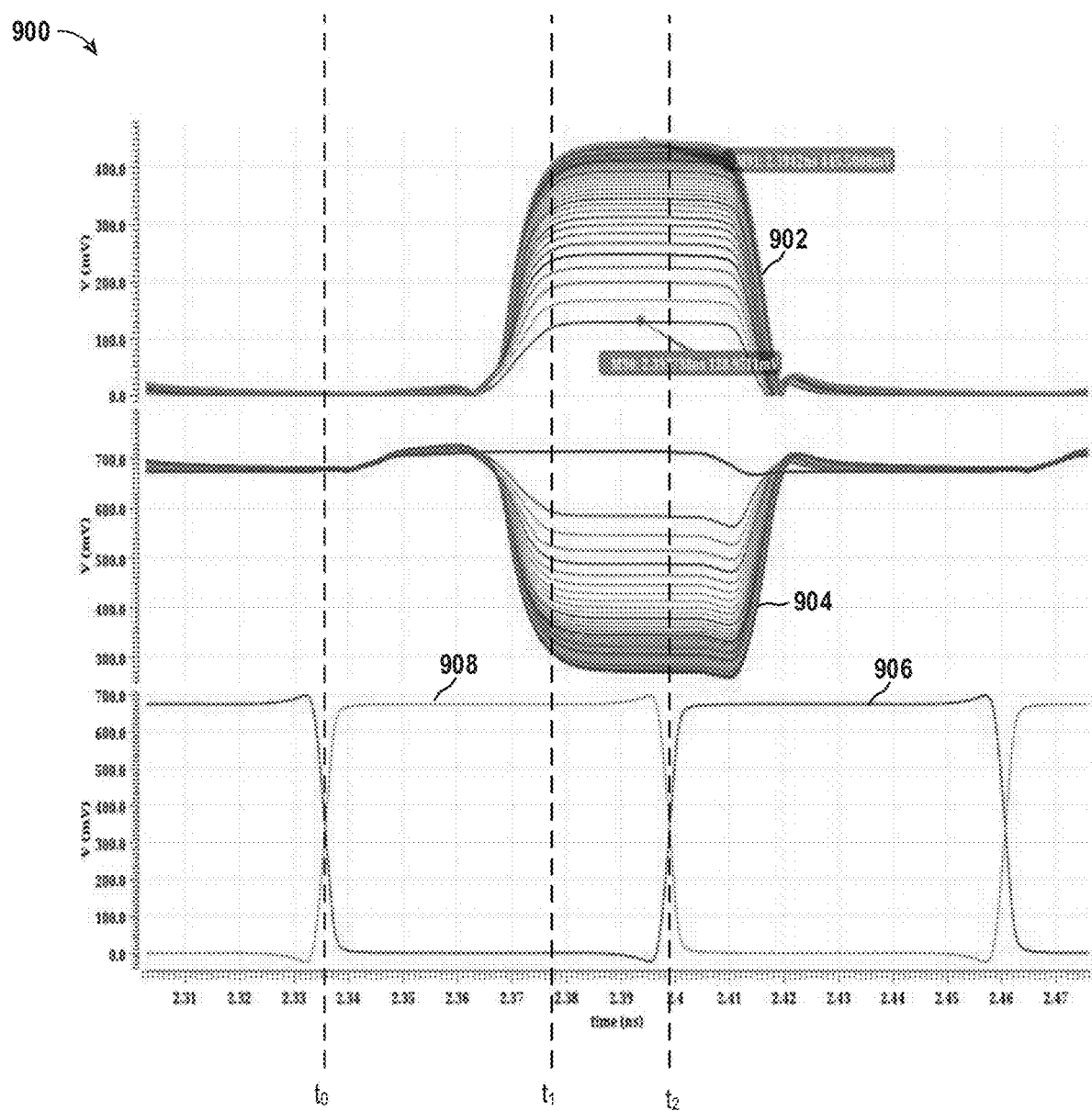
FIG. 9 illustrates an example of another signal diagram associated with an operation of a sampler circuit.

FIG. 9 illustrates an example of another signal diagram 900 associated with an operation of a sampler circuit. In some examples, the sampler circuit can correspond to the sampler circuit 116 or 118, as illustrated in FIG. 1 or the sampler circuit 202 or 204, as illustrated in FIG. 2, or the sampler circuit 300, as illustrated in FIG. 3. Thus, in some examples, references can be made to the example of FIGS. 1-7 in the description with respect to FIG. 9.

As illustrated in the example of FIG. 9, a y-axis of the signal diagram 900 can represent a voltage (V) in millivolts (mV) and an x-axis of the signal diagram 900 can represent a time (t) in nanoseconds (ns). The signal diagram 900 includes a plurality of differential capacitive weighted signals collectively referred to in FIG. 9 with reference 902. The signal diagram 900 further includes a first grouping of single-ended capacitive weighted signals collectively referred to in FIG. 9 with reference 902 and a second grouping of single-ended capacitive weighted signals collectively referred to in FIG. 9 with reference 904. In some examples, the first grouping of single-ended capacitive weighted signals 902 can correspond to the capacitive weighted signal dfe_tap_fb_p, as illustrated in FIGS. 3 and 4, or the capacitive weighted signal dfe_tap2_fb_p, as illustrated in FIG. 7. In some examples, the second grouping of single-ended capacitive weighted signals 904 can correspond to the capacitive weighted signal dfe_tap_fb_m, as illustrated in FIGS. 3 and 4, or the capacitive weighted signal dfe_tap2_fb_m, as illustrated in FIG. 7. By way of further examples, each of the plurality of single-ended capacitive weighted signals 902 and 904 can be received at a respective input to the sampler circuit, such as the FETs 318 and 320 of the sampler circuit 300, as illustrated in FIG. 3.

In some examples, the signal diagram 900 includes a clock signal 906 and a clock signal 908. In some examples, the clock signal 906 can correspond to the clock signal clk_1 (e.g., the clock signal clk0), as illustrated in FIG. 3. In further examples, the clock signal 908 can correspond to the clock signal clk2_delayed (e.g., the clock signal clk180_delayed), as illustrated in FIG. 3. As illustrated in FIG. 9, a first instance of time $t_0$ can correspond to a sample instance during which the sampler circuit samples a data input signal (e.g., the data input signal 224, as illustrated in FIG. 2). A period of time between the first instance of time $t_0$ and a second instance of time $t_1$ can correspond to a closed-loop timing of the second tap feedback path. As illustrated in FIG. 9, by implementing a capacitive coupling feedback circuit as described herein as part of the second tap feedback, each differential capacitive weighted signal 902 can settle at a third instance of time $t_2$ (e.g., at a rising edge of the clock signal 906).

Figure 10:
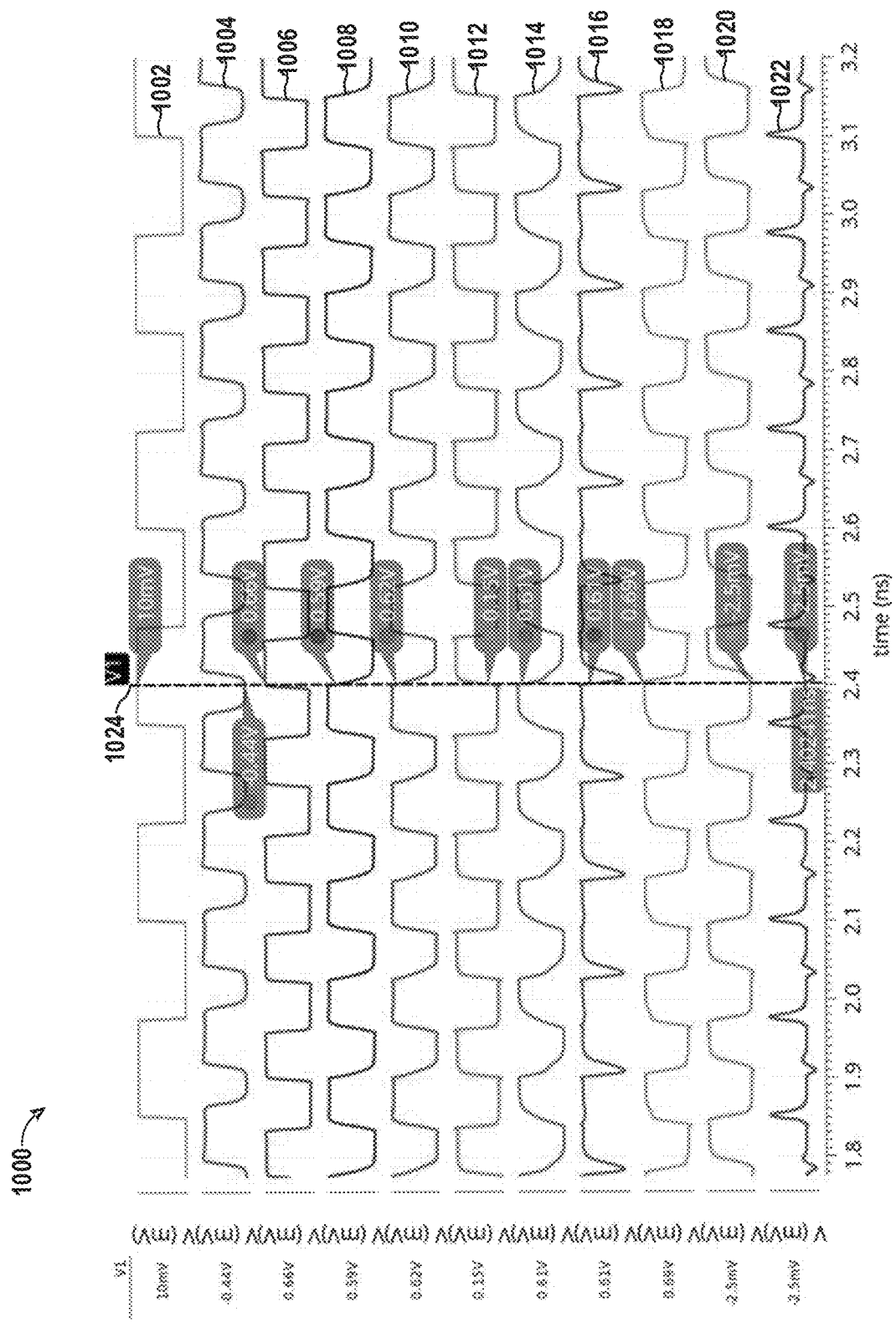
FIG. 10 illustrates an example of a further signal diagram associated with an operation of a sampler circuit.

FIG. 10 illustrates an example of a signal diagram 1000 associated with an operation of a sampler circuit. In some examples, the sampler circuit can correspond to the sampler circuit 116 or 118, as illustrated in FIG. 1 or the sampler circuit 202 or 204, as illustrated in FIG. 2, or the sampler circuit 300, as illustrated in FIG. 3. Thus, in some examples, references can be made to the example of FIGS. 1-7 in the description with respect to FIG. 10.

The signal diagram 1000 can include a differential data input signal 1002 that can be representative of a difference between the data input signal in_p and the data input signal in_n, for example, as illustrated in FIG. 3. The signal diagram 1000 further includes a differential capacitive weighted signal 1004 that can be representative of a difference between the capacitive weighted signal dfe_tap_fb_m and the second capacitive weighted signal dfe_tap_fb_p, for example, as illustrated in FIG. 3. The signal diagram 1000 can further include a clock signal 1006, which can correspond to the first clock signal clk_1 (e.g., the clock signal clk0), as illustrated in FIG. 3. The signal diagram 1000 can further include a pair of first stage output signals 1008 and 1010, which can correspond to the pair of first stage output signals stg1_out_m and signal stg1_out_p, as illustrated in FIG. 3.

In further examples, the signal diagram 1000 includes a clock signal 1012, which can correspond to the clock signal clk_1delayed (e.g., the clock signal clk0_delayed), as illustrated in FIG. 3. The signal diagram 1000 can further include a pair of second stage output signals 1014 and 1016, which can correspond to the pair of second stage output signals stg2_out_m and signal stg2_out_p, as illustrated in FIG. 3. In further examples, the signal diagram 1000 can include a clock signal 1018, which can correspond to the clock signal clk2_delayed (e.g., the clock signal clk180_delayed), as illustrated in FIG. 3. In some examples, the signal diagram 1000 includes detected bit signals out_m_tg and out_p_tg 1020 and 1022, which can correspond to the detected bit signals out_m_tg and out_p_tg 1020 and 1022, as illustrated in FIG. 3. By way of example, as illustrated in FIG. 10, at an instance of time at about 1024 during operation of the receiver, the sampler circuit can have corresponding signal values, as illustrated in FIG. 10 therein.

Figure 11:
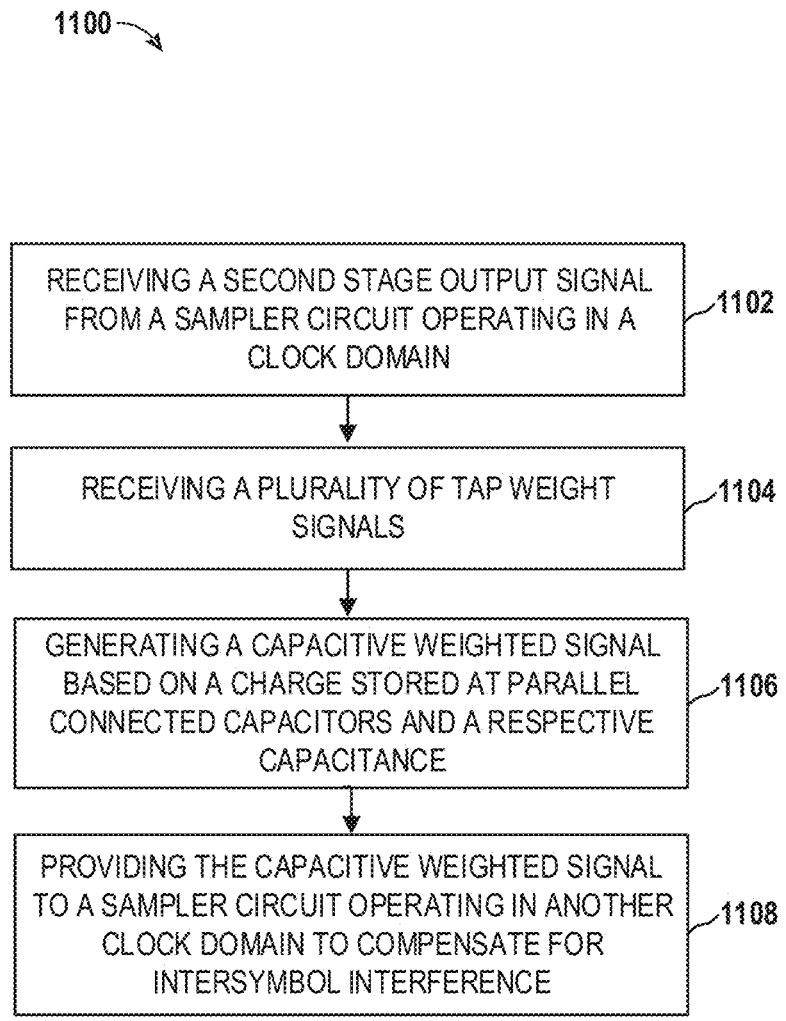
FIG. 11 illustrates an example of a method for generating a capacitive weighted signal.
Figure 12:
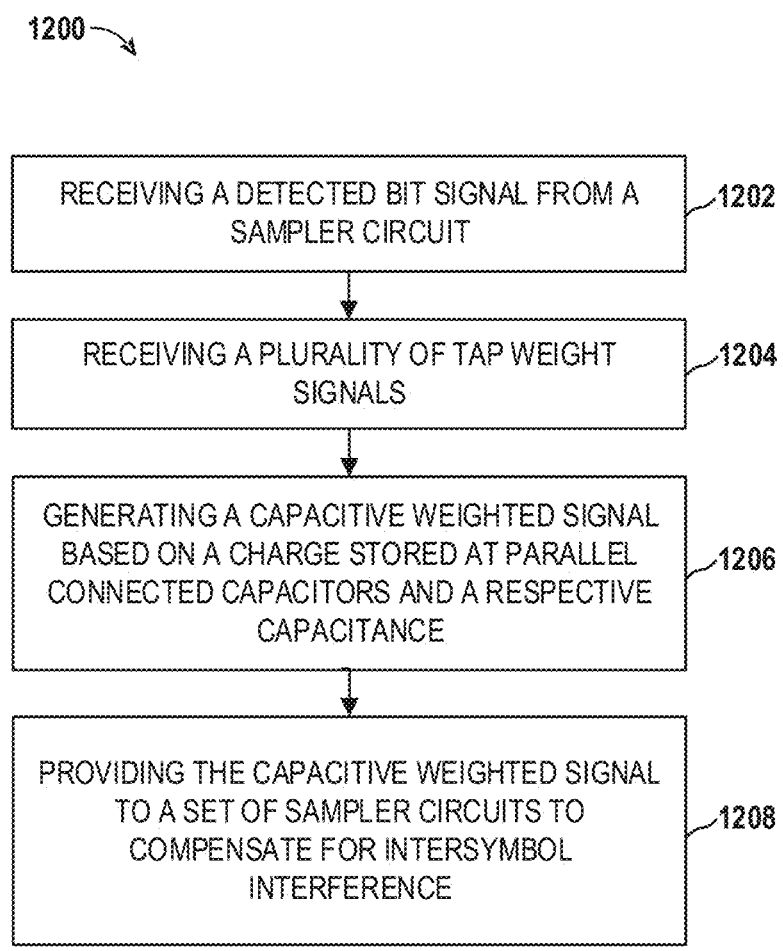
FIG. 12 illustrates an example of another method for generating a capacitive weighted signal.

In view of the foregoing structural and functional features described above, example methods will be better appreciated with references to FIGS. 11-12. While, for purposes of simplicity of explanation, the example methods of FIGS. 11-12 are shown and described as executing serially, it is to be understood and appreciated that the example methods are not limited by the illustrated order, as some actions could in other examples occur in different orders, multiple times and/or concurrently from that shown and described herein.

FIG. 11 illustrates an example of a method 1100 for generating a capacitive weighted signal for a first sampler circuit operating in a first clock domain (e.g., the clock domain 206, as illustrated in FIG. 1) of a receiver. The method 1100 can be implemented by a capacitive coupling feedback circuit, such as the capacitive coupling feedback circuit 122, as illustrated in FIG. 1 or the capacitive coupling feedback circuit 234, as illustrated in FIG. 2, or the capacitive coupling feedback circuit 600, as illustrated in FIG. 6.

The method 1100 can begin at 1102, by receiving a second stage output signal (e.g., the second stage output differential signal that includes the pair of second stage output signals stg2_out_m and stg2_out_p, as illustrated in FIG. 6). The second stage output signal can be provided by a second stage of a second sampler circuit (e.g., the second stage 228 of the sampler circuit 204, as illustrated in FIG. 2) operating in a second clock domain. At 1104, the method 1100 can include receiving a plurality of tap weight signals (e.g., the first and second tap weight signals tap1_weight_p_1 and tap1_weight_p_2, as illustrated in FIG. 6) to control a number of capacitors of a plurality of capacitors of the capacitive coupling feedback circuit are connected in parallel corresponding to controlling an amount of weight applied to the second stage output signal. The capacitors connected in parallel (e.g., the capacitors c1_tap1 and c2_tap1, as illustrated in FIG. 6) can be configured to store a charge and the amount of charge stored at the respective capacitors connected in parallel can correspond to the amount of weight applied to the second stage output signal. Thus, the amount of weight applied to the second stage output signal can be based on a capacitance of the capacitors connected in parallel and the amount of charge stored at the capacitors connected in parallel. At 1106, the method 1100 can include generating the capacitive weighted signal based on the charge stored at the capacitors connected in parallel and the capacitance of the capacitors connected in parallel. At 1108, the method 1100 can include providing the capacitive weighted signal to the first sampler circuit. The capacitive weighted signal can be employed by the first sampler circuit operating in the first clock domain to compensate for ISI caused by the previous bit on the current bit received at the receiver.

FIG. 12 illustrates an example of another method 1200 for generating a capacitive weighted signal for a set of sampler circuits of a receiver (e.g., the receiver 104, as illustrated in FIG. 1). The method 1200 can be implemented by a capacitive coupling feedback circuit, such as the capacitive coupling feedback circuit 122, as illustrated in FIG. 1 or the capacitive coupling feedback circuit 234, as illustrated in FIG. 2, or the capacitive coupling feedback circuit 700, as illustrated in FIG. 7.

The method 1200 can begin at 1202, by receiving a detected bit signal (e.g., the differential detected bit signal that includes the pair of detected bit signals out_m_tg and out_p_tg, as illustrated in FIG. 7). At 1204, the method 1200 can include receiving a plurality of tap weight signals (e.g., the first and second tap weight signals tap2_weight_p_1 and tap2_weight_p_2, as illustrated in FIG. 6) to control a number of capacitors of a plurality of capacitors of the capacitive coupling feedback circuit are connected in parallel corresponding to controlling an amount of weight applied to the detected bit signal. The capacitors connected in parallel (e.g., the capacitors c1_tap2 and c2_tap2, as illustrated in FIG. 7) can be configured to store a charge and the amount of charge stored at the respective capacitors connected in parallel can correspond to the amount of weight applied to the detected bit signal. Thus, the amount of weight applied to the detected bit signal can be based on a capacitance of the capacitors connected in parallel and the amount of charge stored at the capacitors connected in parallel. At 1206, the method 1200 can include generating the capacitive weighted signal based on the charge stored at the capacitors connected in parallel and the capacitance of the capacitors connected in parallel. At 1208, the method 1200 can include providing the capacitive weighted signal to the set of sampler circuits. The capacitive weighted signal can be employed by each of the sampler circuits to compensate for ISI caused by the previous bit on the current bit received at the receiver.

What has been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A system comprising:
a sampler circuit configured to process a data input signal corresponding to a current bit received at a receiver based on a capacitive weighted signal to compensate for distortion effects that a previously received bit at the receiver has on the data input signal; and
a capacitive coupling feedback circuit comprising a plurality of capacitors and is configured to generate the capacitive weighted signal corresponding to a weighted detected bit of the previously received bit based on a capacitance of a subset of capacitors of the plurality of capacitors, wherein the capacitive coupling feedback circuit is configured to selectively control a number of capacitors of the plurality of capacitors that are connected in parallel corresponding to the subset of capacitors to control an amount of weight applied to the detected bit to generate the capacitive weighted signal.

2. The system of claim 1, wherein:
the capacitive coupling feedback comprises a plurality of cap circuits that each comprise a portion of capacitors of the plurality of capacitors; and
the capacitive coupling feedback circuit is configured to couple first and second cap circuits of the plurality of cap circuits, such that the first and second cap circuits are connected in parallel, to control the amount of weight applied to the detected bit to generate the capacitive weighted signal, the amount of weight applied to the detected bit is based on the capacitance of the subset of capacitors of the first and second cap circuits.

3. The system of claim 2, wherein:
the capacitive coupling feedback circuit is further configured to receive a clock signal generated by a clock and data recovery circuit;
the capacitive coupling feedback circuit is configured to generate the capacitive weighted signal according to the clock signal; and
the sampler circuit is operated in a first clock domain and the clock signal is a clocked delayed version of a domain clock signal associated with a second clock domain.

4. The system of claim 3, wherein:
the capacitive coupling feedback circuit comprises an input field-effect transistor (FET) and a set of clock-controlled FETs;
each of the first and second cap circuits comprises a capacitor charging FET that is coupled in series with a respective capacitor, the input FET being coupled to each of the first and second cap circuits and is configured to couple respective first and second cap circuits to a low voltage rail to enable a charge to be stored at the respective capacitor of each of the first and second cap circuits in response to receiving the detected bit;
the set of clock-controlled FETs are coupled to a voltage source circuit and configured to provide a source voltage to the first and second cap circuits for storing of the charge at respective capacitors of the first and second cap circuits in response to the clock signal;
the capacitor charging FET of each the first and second cap circuits is configured to cause the respective capacitor to store the charge based on the source voltage in response to receiving a respective tap weight signal; and
the capacitive weighted signal is generated based on the charge stored at the respective capacitor and the capacitance of the respective capacitor of each of the first and second cap circuits.

5. The system of claim 4,
wherein:
the previously received bit corresponds to a differential detected bit signal, the differential detected bit signal comprising a first detected bit signal and a second detected bit signal, and the input FET corresponds to a first input FET;
the respective capacitor of the first cap circuit corresponds to a first capacitor and the respective capacitor of the second cap circuit corresponds to a second capacitor;
the plurality of cap circuits comprises a third cap circuit and a fourth cap circuit, the third cap circuit comprising a third capacitor of the plurality of capacitors and a fourth cap circuit comprising a fourth capacitor of the plurality of capacitors;
the capacitor charging FET of each of the first and second cap circuits corresponds to first and second charging FETs;
the capacitive weighted signal corresponds to a differential capacitive weighted signal comprising a first capacitive weighted signal and a second capacitive weighted signal;
the respective tap weight signal received by each of the first and second charging FETs corresponds to a first tap weight signal and a second tap weight signal;
the set of clock-controlled FETs corresponds to a first set of clock-controlled FETs; and
further comprising a second input FET, third and fourth capacitor charging FETs, a second set of clock-controlled FETs, and a second set of clock-controlled FETs coupled to the voltage source circuit and configured to provide the source voltage to the third and fourth cap circuits in response to the clock signal, the third cap circuit comprising the third capacitor charging FET and the fourth cap circuit comprising the fourth capacitor charging FET.

6. The system of claim 5, wherein:
the first capacitor charging FET of the first cap circuit is configured to cause the first capacitor of the first cap circuit to store the charge at the first capacitor based on the source voltage in response to receiving the first tap weight signal;
the second capacitor charging FET of the second cap circuit is configured to cause the second capacitor of the second cap circuit to store the charge at the second capacitor based on the source voltage in response to receiving the second tap weight signal;
the third capacitor charging FET of the third cap circuit is configured to cause the third capacitor of the third cap circuit to store the charge at the third capacitor based on the source voltage in response to receiving a third tap weight signal;

the fourth capacitor charging FET of the fourth cap circuit is configured to cause the second capacitor of the second cap circuit to store a charge at the fourth capacitor based on the source voltage in response to receiving a fourth tap weight signal;

the first capacitive weighted signal is generated based on the charged stored at the first and second capacitors and the capacitance of the first and second capacitors; and the second capacitive weighted signal is generated based on the charged stored at the third and fourth capacitors and the capacitance of the third and fourth capacitors.

7. The system of claim 6, wherein the sampler circuit comprises a set of main FETs and a set of auxiliary FETs, and the data input signal corresponds to a differential data input signal comprising a first data input signal and a second data input signal, the set of main FETs being configured to receive a respective one of the first and second data input signals, and the set of auxiliary FETs being configured to receive a respective one of the first and second capacitive weighted signals, the sampler circuit being configured to process the first and second data input signals and the first and second capacitive weighted signals to compensate for the distortion effects that the previously received bit has on the current bit received at the receiver.

8. The system of claim 7,
wherein:
the capacitive coupling feedback circuit corresponds to a first capacitive coupling feedback circuit; and
the differential capacitive weighted signal corresponds to a first differential capacitive weighted signal;
the plurality of capacitors of the first capacitive coupling feedback circuit corresponds to a first group of capacitors;
the previously received bit corresponds to a second previously received bit that is received at the receiver after a first previously received bit is received at the receiver prior to the current bit being received at the receiver;
the sampler circuit is a first sampler circuit; and
further comprising:
a second capacitive coupling feedback circuit comprising a second group of capacitors and is configured to generate a second differential capacitive weighted signal corresponding to a weighted differential detected bit of the second previously received bit based on a capacitance of a subset of capacitors of the second group of capacitors and a stage output signal generated by a third sampler circuit operating in a third clock domain, wherein the second capacitive coupling feedback circuit is configured to selectively control a number of capacitors of the second group of capacitors that are connected in parallel corresponding to the subset of capacitors of the second group of capacitors to control an amount of weight applied to the stage output signal to generate the second differential capacitive weighted signal; and
a second sampler circuit being configured to process the data input signal based on the second differential capacitive weighted signal to compensate for distortion effects that the first previously bit has on the current bit.

9. The system of claim 1,
wherein the data input signal corresponds to a partially compensated data input signal;
further comprising a summation circuit configured to receive a transmitted data input signal and a non-capacitive weighted signal for intersymbol interference (ISI) correction with respect to a horizontal data eye opening for the receiver and sum the transmitted data input signal and the non-capacitive weighted signal to provide the partially compensated data input signal, wherein the partially compensated data input signal is compensated for at least some of the distortion effects that the previously received bit has on the current bit, and the non-capacitive weighted signal is generated by a tap generator configured to process the previously received bit based on a corresponding coefficient value; and
wherein the sampler circuit is configured to process the partially compensated data input signal and the capacitive weighted signal for ISI correction with respect to a vertical data eye opening for the receiver to further compensate for the distortion effects that the previously received bit has on the current bit.

10. A system comprising:
a sampler circuit operating in a first clock domain and is configured to process a data input signal corresponding to a current bit received at a receiver based on a capacitive weighted signal to compensate for distortion effects that previously received bit at the receiver has on the data input signal; and
a capacitive coupling feedback circuit comprising a plurality of capacitors and is configured to generate the capacitive weighted signal corresponding to a weighted detected bit of the previously received bit based on a capacitance of a subset of capacitors of the plurality of capacitors and a stage output signal generated by another sampler circuit operating in a second clock domain, wherein the other sampler circuit is configured to generate the stage output signal during a processing of the data input signal, and the capacitive coupling feedback circuit is configured to selectively control a number of capacitors of the plurality of capacitors that are connected in parallel corresponding to the subset of capacitors to control an amount of weight applied to the stage output signal to generate the capacitive weighted signal.

11. The system of claim 10, wherein:
the capacitive coupling feedback comprises a plurality of cap circuits comprising a portion of capacitors of the plurality of capacitors; and
the capacitive coupling feedback circuit is configured to couple a first and second cap circuit of the plurality of capacitors, such that the first and second cap circuits are connected in parallel, to control the amount of weight applied to the stage output signal to generate the capacitive weighted signal, the amount of weight applied to the stage output signal is based on the capacitance of the subset of capacitors of the first and second cap circuits.

12. The system of claim 11, wherein:
the capacitive coupling feedback circuit is further configured to receive a clock signal generated by a clock and data recovery circuit, the clock signal being a clocked delayed version of a domain clock signal associated with the second clock domain;
the capacitive coupling feedback circuit is configured to generate the capacitive weighted signal according to the clock signal.

13. The system of claim 12, wherein:
the capacitive coupling feedback circuit comprises an input field-effect transistor (FET) and a set of clock-controlled FETs;
each of the first and second cap circuits comprises a capacitor charging FET coupled in series with a respective capacitor, the input FET being coupled to each of the first and second cap circuits and is configured to provide a source voltage generated by a voltage source circuit to each of the first and second cap circuits, the set of clock FETs being configured to provide a current path for a current to flow through the respective capacitor that is based on the source voltage to enable a charge to be stored at the respective capacitor;
the capacitor charging FET of each the first and second cap circuits is configured to cause the respective capacitor to store based on the source voltage in response to receiving a respective tap weight signal; and
the capacitive weighted signal is generated based on the charge stored at the respective capacitor and the capacitance of the respective capacitor of each of the first and second cap circuits.

14. The system of claim 13, wherein:
the stage output signal corresponds to a differential stage output signal comprising a first stage output signal and a second stage output signal, and the input FET corresponds to a first input FET;
the capacitor of the first cap circuit corresponds to a first capacitor and the capacitor of the second cap circuit corresponds to a second capacitor;
the plurality of cap circuits comprise a third cap circuit and a fourth cap circuit, the third cap circuit comprising a third capacitor of the plurality of capacitors and a fourth cap circuit comprising a fourth capacitor of the plurality of capacitors;
the capacitive weighted signal corresponds to a differential capacitive weighted signal comprising a first capacitive weighted signal and a second capacitive weighted signal;
the respective tap weight signal received by each of the first and second charging FETs corresponds to a first tap weight signal and a second tap weight signal; and
further comprising a second input FET, third and fourth capacitor charging FETs, and a second set of clock-controlled FETs coupled to the voltage source circuit and configured to provide the source voltage to the third and fourth cap circuits in response to the clock signal, the third cap circuit comprising the third capacitor charging FET and the fourth cap circuit comprising the fourth capacitor charging FET.

15. The system of claim 14, wherein:
the first capacitor charging FET of the first cap circuit is configured to cause the first capacitor of the first cap circuit to store the charge based on the source voltage in response to receiving the first tap weight signal;
the second capacitor charging FET of the second cap circuit is configured to cause the second capacitor of the second cap circuit to store the charge based on the source voltage in response to receiving the second tap weight signal.

16. The system of claim 15, wherein:
the second input FET is coupled to each of the third and fourth cap circuits and is configured to provide the source voltage generated by the voltage source circuit to each of the third and fourth cap circuits, the second set of clock FETs being configured to provide a current path for a current to flow through the third and fourth capacitors based on the source voltage to enable a charge to be stored at the third and fourth capacitors;
the third capacitor charging FET of the third cap circuit is configured to cause the third capacitor of the third cap circuit to store the charge based on the source voltage in response to receiving a third tap weight signal;
the fourth capacitor charging FET of the fourth cap circuit is configured to cause the second capacitor of the second cap circuit to store a charge at the fourth capacitor based on the source voltage in response to receiving a fourth tap weight signal;
the first capacitive weighted signal is generated based on the charged stored at the first and second capacitors and the capacitance of the first and second capacitors; and
the second capacitive weighted signal is generated based on the charged stored at the third and fourth capacitors and the capacitance of the third and fourth capacitors.

17. The system of claim 16, wherein:
the capacitive coupling feedback circuit corresponds to a first capacitive coupling feedback circuit; and
the differential capacitive weighted signal corresponds to a first differential capacitive weighted signal;
the plurality of capacitors of the first capacitive coupling feedback circuit corresponds to a first group of capacitors and the subset of capacitors of the plurality of capacitors corresponds to a first subset of capacitors;
the previously received bit corresponds to a first previously received bit that is received at the receiver before a second previously received bit is received at the receiver prior to the current bit being received at the receiver; and
the sampler circuit is a first sampler circuit and the other sampler circuit is a second sampler circuit;
further comprising a second capacitive coupling feedback circuit comprising a second group of capacitors and is configured to generate a second differential capacitive weighted signal corresponding to a weighted differential detected bit of the second previously received bit based on a capacitance of a second subset of capacitors of the second group of capacitors, wherein the second capacitive coupling feedback circuit is configured to selectively control a number of capacitors of the second group of capacitors that are connected in parallel corresponding to the second subset of capacitors to control an amount of weight applied to a differential detected bit of the second previously received bit to generate the second differential capacitive weighted signal, wherein one of the second and a third sampler circuit is configured to process the data input signal based on the second differential capacitive weighted signal to compensate for distortion effects that the second previously received bit has on the current bit received at the receiver.

18. The system of claim 10, wherein the data input signal corresponds to a partially compensated data input signal;
further comprising a summation circuit configured to receive a transmitted data input signal and a non-capacitive weighted signal for intersymbol interference (ISI) correction with respect to a horizontal data eye opening for the receiver and sum the transmitted data input signal and the non-capacitive weighted signal to provide the partially compensated data input signal, wherein the partially compensated data input signal is compensated for at least some of the distortion effects that the previously received bit has on the current bit, and the non-capacitive weighted signal is generated by a tap generator configured to process the previously received bit based on a corresponding coefficient value; and wherein the sampler circuit is configured to process the partially compensated data input signal and the capacitive weighted signal for ISI correction with respect to a vertical data eye opening for the receiver to further compensate for the distortion effects that the previously received bit has on the current bit.

19. A method comprising:

receiving one of a detected data input signal provided by a first sampler circuit and a stage output signal provided by a second sampler circuit, the detected data input signal corresponding to a previously detected bit of a previously received bit at a receiver, and the stage output signal being generated by the second sampler circuit during a processing of a subsequent data input signal corresponding to a current bit received at the receiver to compensate for distortion effects that the previously received bit has on the current bit;

receiving one of a first clock signal and a second clock signal generated by a clock and data recovery circuit, the first clock signal being a clocked delayed version of a first domain clock signal associated with the first clock domain, and the second clock signal being a clocked delayed version of a second domain clock signal associated with the second clock domain;

receiving a plurality of tap weight signals to selectively control a number of cap circuits of a plurality of cap circuits to couple in parallel to control an amount of weight applied to one of the detected data input signal and the stage output signal based on one of the first and second clock signals; and generating a capacitive weight signal based on a capacitance of the number of cap circuits of the plurality of cap circuits coupled in parallel.

20. The method claim 19, further comprising:

receiving a transmitted data input signal and a non-capacitive weighted signal, the non-capacitive weighted signal is generated by a tap generator configured to process the previously received bit based on a corresponding coefficient value;

summing the transmitted data input signal and the non-capacitive weighted signal to provide the subsequent data input signal, wherein the subsequent data input signal is partially compensated for at least some of the distortion effects that the previously received bit has on the current bit; and processing the subsequent data input signal based on the capacitive weighted signal to further compensate for distortion effects that the previously received bit has on the current bit.

* * * * *